(12) United States Patent
Miracky et al.

(10) Patent No.: US 6,636,653 B2
(45) Date of Patent: Oct. 21, 2003

(54) INTEGRATED OPTICAL MICRO-ELECTROMECHANICAL SYSTEMS AND METHODS OF FABRICATING AND OPERATING THE SAME

(75) Inventors: Robert F. Miracky, Cedar Park, TX (US); Jason D. Reed, W. Hartford, CT (US); Kai Hu, Farmingdale, NJ (US); Claude Hilbert, Austin, TX (US)

(73) Assignee: Teravicta Technologies, Inc., Austin, TX (US)

( * ) Notice: Subject to any disclaimer, the term of this patent is extended or adjusted under 35 U.S.C. 154(b) by 150 days.

(21) Appl. No.: 09/775,867

(22) Filed: Feb. 2, 2001

(65) Prior Publication Data

US 2002/0105699 A1 Aug. 8, 2002

(51) Int. Cl.[7] .......................... G02B 6/12; H01L 21/00; G02F 1/03

(52) U.S. Cl. .............................. 385/14; 385/31; 385/33; 385/35; 385/92; 385/93; 385/129; 385/130; 385/131; 385/52; 438/26; 438/27; 438/28; 438/29; 438/31; 359/248; 359/298; 359/319; 359/698

(58) Field of Search .............................. 385/14, 31, 33, 385/34, 35, 25, 88, 89, 92, 93, 94, 129, 130, 131, 132, 52; 438/26, 27, 28, 29, 31; 359/248, 298, 319, 698

(56) References Cited

U.S. PATENT DOCUMENTS

| | | | | |
|---|---|---|---|---|
| 5,771,321 A | * | 6/1998 | Stern | 385/31 |
| 6,091,537 A | | 7/2000 | Sun et al. | 359/248 |
| 6,137,105 A | * | 10/2000 | Drobot et al. | 250/234 |
| 6,271,052 B1 | * | 8/2001 | Miller et al. | 438/50 |
| 6,353,492 B2 | * | 3/2002 | McClelland et al. | 359/254 |

OTHER PUBLICATIONS

Aksyuk et al., "Low insertion loss packaged and fiber–connectorized SI surface–micromachined reflective optical switch," 79–82, Solid–State Sensor and Actuator Workshop, South Carolina, Jun. 2000.

(List continued on next page.)

Primary Examiner—Brian Healy
(74) Attorney, Agent, or Firm—Fulbright & Jaworski, LLP

(57) ABSTRACT

An apparatus and method of fabricating and operating a micro-electromechanical systems (MEMS) integrated optical structure is disclosed. Micro-optics is integrated with MEMS actuators to provide a building block for a micro-optical communication device. Such micro-optical communication device may realize a variety of optical communication systems including optical interconnects, laser communications, or fiber optic switches. In accordance with one aspect of the present invention, a micro-optical element such as a micro-lens is advantageously integrated with an actuator such as MEMS comb drive actuator to form a MEMS lens assembly. The MEMS lens assembly is further coupled to an optical source which may provide a MEMS integrated micro-optical communication device. This integration substantially obviates the generally needed external or manual positioning of the micro-optical element to align a light beam or an optical signal being emitted from the optical source. The MEMS comb drive actuator, responsive to an actuation force, selectively positions the micro-optical element. By appropriately micro positioning a micro-optical element such as a micro-lens relative to an optical source, such as an input optical fiber or a laser diode, a focused light beam or an optical signal may be coupled to a respective optical fiber or a detector. In one embodiment, a commonly used flip chip module assembly technique may be adapted for bonding the MEMS lens assembly to a carrier substrate, which preferably receives the optical source. The carrier substrate is generally disposed on a host assembly. A flip chip based passive alignment of the MEMS lens assembly could be provided. Additionally, an active alignment of the light beam or optical signal with an optical detector may be provided, which can be maintained through a feedback loop.

52 Claims, 14 Drawing Sheets

OTHER PUBLICATIONS

Armani et al., "Re-configurable fluid circuits by PDMS elastomer micromachining," *IEEE*, 222–227, 1999.

Behin et al., "Magnetically actuated micromirrors for fiber-optic switching," 273–276, Solid–State Sensor and Actuator Workshop, South Carolina, Jun. 2000.

Chen et al., "A low voltage micromachined optical switch by stress-induced bending," *IEEE*, 424–428, 1999.

Dewa and Orcutt, "Development of a silicon two-axis micromirror for an optical cross-connect," 93–96, Solid-State Sensor and Actuator Workshop, South Carolina, Jun. 2000.

Dhuler et al., "Microsystems for three axis active fiber alignment," 277–278, Solid–State Sensor and Actuator Workshop, South Carolina, Jun. 2000.

Fletcher et al., "Micromachined scanning refractive lens," 263–266, Solid–State Sensor and Actuator Workshop, South Carolina, Jun. 2000.

Grade et al., "A large-deflection electrostatic actuator for optical switching applications," 97–100, Solid–State Sensor and Actuator Workshop, South Carolina, Jun. 2000.

Hoshino et al., "A one-chip scanning retina with an integrated micro-mechanical scanning actuator for a compound eye visual sensor," MEMS 2000 Proceedings.

Ikeda et al., "PZT thin-film actuator driven micro optical scanning sensor by 3D integration of optical and mechanical devices," *IEEE*, 435–440, 1999.

Jensen, "The impact of MEMS on the chemical and pharmaceutical industries," 105–110, Solid–State Sensor and Actuator Workshop, South Carolina, Jun. 2000.

Lee et al., "2x2 MEMS fiber optic switches with silicon sub-mount for low-cost packaging," 281–284, Solid–State Sensor and Actuator Workshop, South Carolina, Jun. 2000.

Lee et al., "Single crystal silicon (SCS) XY—stage fabricated by DRIE and IR alignment," MEMS 2000 Proceedings.

Schenk et al., "An electrostatically excited 2D–Micro–scanning–mirror with an in-plane configuration of the driving electrodes," MEMS 2000 Proceedings.

Sun et al., "Scanning microlens shuttles fabricated using silicon–on–insulator wafers," 259–262, Solid–State Sensor and Actuator Workshop, South Carolina, Jun. 2000.

Tuantranont et al., "MEMS—controllable microlens array for beam steering and precision alignment in optical interconnect systems," 101–104, Solid–State Sensor and Actuator Workshop, South Carolina, Jun. 2000.

Tuantranont et al., "Smart phase-only micromirror array fabricated by standard CMOS process," MEMS 2000 Proceedings, 455, 460.

Yokoyama et al., "Micro-optical switch with uni-directional I/O fibers," MEMS 2000 Proceedings.

Hiroshi Toshiyosi, "Microlens 2D Scanner for Free-space Optical Cross Connector," as it appeared on the Fujita Laboratory web site at: http://toshi.fujita3.iis.u–tokyo.ac.jp, Sep. 9, 2002.

Hiroshi Toshiyoshi et al., "Surface Micromachined 2D Lens Scanner Array," Proc. IEEE/LEOS Optical MEMS, Kauai, Hawaii, Late News Session, PD–1, Aug. 21–24, 2000.

"Surface Micromachined 2D Lens Scanner," Proc. IEEE/LEOS International Conference on Optical EMMS, Kauai, Hawaii, Aug. 21–24, 2000.

"Micromechanical Lens Scanners for Fiber Optic Switches," Proc. $3^{rd}$ Int'l Conf. On Micro Opto Electro Mechanical Systems (MOEMS 99), Mainz, Germany, pp. 165–170, Aug. 30–Sep. 1, 1999.

* cited by examiner

INTEGRATED OPTICAL MICRO-ELECTROMECHANICAL SYSTEMS AND METHODS OF FABRICATING AND OPERATING THE SAME

TECHNICAL FILED OF THE INVENTION

The present invention relates to micro-electromechanical systems (MEMS) with integrated optical devices, in particular, to an assembly having micro-lenses integrated with MEMS actuators.

BACKGROUND OF THE INVENTION

Optical communication systems increasingly require the use of lightweight and low-cost optical devices or subsystems. A large number of such optical devices or subsystems including optical transmitters and receivers used in prior art suffer from mediocre performance. Such optical transmitters or receivers are generally devised using micro-fabrication technologies with semiconductor and conductive material layers. However, the drive towards unprecedented functionality in such optical communication systems requires the seamless integration of micro-electrical, optical and mechanical components. The success of micro-electromechanical systems (MEMS) technology and general trends toward miniaturization of the optical devices or subsystems could significantly benefit optical communication systems. MEMS technology can meet the need for integrated optical devices or subsystems by using suitable semiconductor, insulator, and conductive material for multilevel layered miniature structures and interconnects. The deployment of MEMS technology, in optical communication systems, could allow fabrication of inexpensive optical devices in a batch process. Consequently, MEMS technology is poised to make a significant impact in the field of optical communications.

Although MEMS based optical devices are generally a fraction of cost, size, and weight of typical optical communication systems, they are significantly important for ensuring performance, reliability and affordability of such systems. Despite seemingly obvious advantages of MEMS technology for optical communication, enhanced MEMS fabrication methods are desired for new systems functionality. Regardless of the fabrication process employed, generally MEMS fabrication processes encompass three key features including miniaturization, multiplicity, and microelectronics. A typical MEMS fabrication approach includes a variety of deposition and etching steps that could be based on both wet and dry procedures that selectively add or remove material from a wafer. Among other things, however, the challenge is to provide an ease of fabricating and integrating MEMS components with micro-optical components both in monolithic and/or hybrid forms. Integrated micro-opto-mechanical components for optical communication systems including fiber-optic switches and/or optical interconnects can usher an optical communication revolution providing high bandwidth and speed increasingly desired for most advanced communication applications. For example, applications could include high bandwidth interconnect for high performance computer systems, reconfigurable crossbar interconnect for high bandwidth applications, streerable optical communication systems, and all-optical fiber crossbar switch.

At present, in a variety of optical communication systems, micro-optics elements such as reflective micro-optics elements are combined with micro-electromechanical systems (MEMS) to provide MEMS integrated micro-optical communication devices. Typically, such MEMS integrated micro-optical communication devices comprising reflective micro-optical elements suffer from several shortcomings. For example, in a variety of optical communication applications, it is difficult to micro-position various micro-optical elements for precise alignment of light beams or optical signals. Although the precision with which the micro-optical elements must be positioned varies according to a particular application, the micro-optical elements must oftentimes be aligned to within several microns to several tenths of microns. Typical applications that require such micro positioning include optical interconnect systems, laser communications systems, and free space fiber optic switches. For example, in free space fiber optic switches, alignment of a light beam or an optical signal emitted from an optical fiber is desired. More specifically, the alignment of the light beam of an input optical fiber, with another optical element is needed to perform free space beam steering of the light beam traveling through the input optical fiber. By appropriately micro positioning a micro-optical element relative to the input optical fiber or a laser diode, the light beam or optical signal provided by the input optical fiber or laser diode can be coupled to a respective optical fiber or a detector.

Unfortunately, for such optical communication systems, MEMS integrated micro-optical communication devices of the prior art have been limited in their abilities and applications. Furthermore, it is difficult to fabricate MEMS integrated micro-optical communication devices, which provide the desired ability to micro-position micro-optical elements for steering a light beam or an optical signal.

One technique for optical communication includes forming reflective micro-optical elements, such as micro-mirrors. Such prior art micro-mirror based micro-optical communication devices typically require numerous components to construct and operate, and hence are generally less reliable. In addition, most micro-mirrors based micro-optical systems require a multi-segment folded optical path that increases the size of the system. Therefore, in micro-mirrors based micro-optical communication devices, micro-mirrors can typically not be mounted in close proximity to optical sources, leading to less power efficiency and less compactness and reduced transmission distances.

Moreover, typical actuation force generators employed to selectively modify positions of the micro-mirrors, either in a reference plane or a selected direction, may not rapidly traverse a desired range of displacements for the micro-mirrors. In the absence of such capabilities, the utility and applications of MEMS integrated micro-optical communication devices having reflective micro-optical elements integrated with MEMS are significantly limited.

Accordingly, there is a need for improved micro-electromechanical systems (MEMS) integrated micro-optical communication devices suitable for beam forming and steering to enable optical communication including, but not limited to, an optical transmission, switching, and/or rapid alignment.

SUMMARY OF THE INVENTION

The present invention generally provides integrated micro-electromechanical systems (MEMS) and methods of fabricating and operating the same. In an exemplary embodiment, an integrated optical apparatus includes a micro-electromechanical member and a substantially transmissive micro-optical element coupled to the micro-electromechanical member such as a MEMS structure. The integrated optical apparatus may further include an actuator for operating the substantially transmissive micro-optical element to manipulate an optical output from an optical source disposed proximal to the micro-electromechanical member. The optical source may be in a coaxial alignment with the substantially transmissive micro-optical element such as a micro-lens. The micro-electromechanical member may be coplanar to the micro-lens, which may collimate or focus the optical output to form a light beam. The micro-lens may steer the light beam in a first selected direction responsive to an actuator input applied to the actuator. The actuator may selectively position the micro-lens in response to an actuating force for steering the focussed light beam in the first selected direction to form a steered light beam. The actuating force could be an applied voltage bias and an actuating force profile may determine the first selected direction and a position of the micro-lens. The actuator could be a comb drive actuator generally formed on a substrate. Such a comb drive actuator may include one or more fixed combs and one or more movable combs. The one or more movable combs may be displaced in response to the actuating force and they may include a frame to fixedly hold the micro-lens.

The comb drive actuator may further include at least one suspension member, each suspension member operably connected at a first end to the frame and at a second end to the substrate to generally suspending the frame. Selective positioning of the micro-lens may generally control a spatial alignment of the steered light beam. Moreover, the selective positioning of the micro-lens may be provided in a first displacement direction coplanar to a major surface of the micro-electromechanical member in response to a first type of the actuating force.

Alternatively, such selective positioning of micro-lens may be provided in a second displacement direction coplanar to the major surface of the micro-electromechanical member in response to a second type of the actuating force. In addition, the micro-lens may be positioned in a third displacement direction coplanar to the major surface of the micro-electromechanical member responsive to a concurrent application of the first type of the actuating force and the second type of the actuating force.

In an exemplary method of fabricating an exemplary integrated optical apparatus, a micro-electromechanical member such as a MEMS structure having an aperture may be formed. And a substantially transmissive micro-optical element such as a micro-lens may be interposed at the aperture generally provided in a micro-electromechanical optical assembly, which may be released to form the micro-electromechanical optical assembly. In one embodiment, the exemplary method of fabricating the integrated optical apparatus includes forming a first structural material layer over a substrate, a sacrificial material layer over the first structural material layer, and a second structural material layer over the sacrificial material layer. To form the micro-lens, an optical material layer having a major surface may be provided to fill in the aperture. The micro-electromechanical optical assembly may be further processed for adapting the major surface of the optical material layer into a spherical profile. Also, the micro-electromechanical member may be formed on a substantially transparent substrate.

In accordance with one aspect of the present invention, an exemplary optical communication apparatus may include an optical source to emit a light beam and a micro-electromechanical assembly such as a MEMS structure. The micro-electromechanical assembly may include a transmissive micro-optical element such as a micro-lens to receive the light beam for focusing and selective steering. And the micro-electromechanical assembly may be coupled to the optical source. The micro-electromechanical assembly may further include a comb drive actuator. Such comb drive actuator may be formed on a substrate to selectively position micro-lens in response to an actuating force applied to the comb drive actuator. Accordingly, the light beam may be steered to provide a steered light beam for an active alignment. Such active alignment may dynamically align the steered light beam in a selected direction in response to the actuating force. A feedback control loop may maintain a spatial alignment of the steered light beam. The micro-electromechanical assembly could be formed on a transparent substrate utilizing a deposition process, which may include forming one or more support layers. The optical source may be, but is not limited to, a laser diode, a fiber, a vertical cavity surface emitting laser diode, or an edge emitting laser diode. Likewise, the micro-lens may be, but is not limited to, a photo-polymer or polymer micro-lens, a glass or quartz micro-lens, or a semiconductor micro-lens. The micro-lens may be coplanar with a major surface of the micro-electromechanical assembly.

In another exemplary embodiment, the optical source may be an input fiber disposed in a fiber optical cross connect switch. A micro-electromechanical assembly such as a MEMS structure may perform switching of a light beam received at the input fiber to optically link the received light beam to a first output fiber of a plurality of output fibers disposed substantially facing the input fiber of the fiber optical cross connect switch.

In one exemplary embodiment, comb drive actuator may include one or more fixed comb, and one or more movable comb. The movable combs may be displaced in response to an actuating force such as an electrostatic force. The movable combs may include a frame to hold a micro-lens and at least one suspension member, each suspension member operably connected at a first end to the frame and at a second end to the substrate for suspending the movable combs.

In accordance with one aspect of the present invention, an optical communication apparatus may include a plurality of optical sources, each of the optical sources emitting a light beam, and a micro-electromechanical assembly such as a MEMS structure. The micro-electromechanical assembly may include transmissive micro-optical elements such as micro-lenses corresponding to each of the optical sources for focusing and steering the respective light beams generally received at the corresponding micro-lenses. And the micro-electromechanical assembly may be coupled to the plurality of optical sources. The micro-electromechanical assembly may further include a comb drive actuator. Such comb drive actuator may be formed on a substrate to selectively position the transmissive micro-optical elements in response to an actuating force applied to the comb drive actuator. Accordingly, the light beams may be steered individually or jointly to provide respective steered light beams for an active alignment. Such active alignment may dynamically align the respective steered light beams in a, selected direction in response to the actuating force. The micro-electromechanical assembly may be formed on a transparent substrate. A corresponding feedback control loop may maintain a spatial alignment for each of the steered light beams. The micro-electromechanical assembly could be formed on a transparent substrate utilizing a deposition process, which may include forming one or more support layers. The optical sources may be, but not limited to, a laser diode array, a fiber array, a vertical cavity surface emitting laser diode array, or an edge emitting laser diode array. Likewise, the micro-lenses may be, but are not limited to photo-polymer or polymer micro-lenses, glass or quartz micro-lenses, or semiconductor micro-lenses. The micro-lenses may be coplanar with a major surface of the micro-electromechanical assembly.

In another exemplary embodiment, each optical source may be an input fiber disposed in a fiber optical cross connect switch. A micro-electromechanical assembly such as a MEMS structure may perform switching of respective light beams received at associated input fibers to optically link the received respective light beams to a corresponding output fiber of a plurality of output fibers disposed substantially facing the input fibers of the fiber optical cross connect switch.

In one exemplary embodiment, comb drive actuator may include one or more fixed combs, and one or more movable combs. The movable combs may be displaced in response to an actuating force such as an electrostatic force. The movable combs may include a frame to hold micro-lenses and at least one suspension member, each suspension member operably connected at a first end to the frame and at a second end to a substrate for suspending the movable combs.

In accordance with one aspect of the present invention, an exemplary optical communication apparatus may include an optical source to emit a light beam and a micro-electromechanical assembly such as a MEMS structure. The micro-electromechanical assembly may be formed on a transmissive substrate substantially parallel to a horizontal plane. Such a micro-electromechanical assembly may include an electrostatic comb drive actuator having a micro-lens for focusing the light beam. The micro-electromechanical assembly could be coupled to the optical source for selectively steering the light beam. The electrostatic comb drive actuator may further include one or more fixed combs, each having a first set of fingers, and one or more movable comb, each having a second set of fingers which are in an interdigitized arrangement with the first set of fingers. The movable combs may be displaced within the horizontal plane in response to an actuating potential being applied to the electrostatic comb drive actuator. The movable combs may include a micro-lens frame to hold the micro-lens and at least one suspension member, each suspension member attached at a first end to the micro-lens frame and at a second end to the transmissive substrate for suspending the movable combs substantially parallel to the horizontal plane.

In accordance with another aspect of the present invention, an exemplary optical communication apparatus may include an optical signal sensing device for tracking the steered light beam such that the optical signal sensing device may provide a feedback signal to dynamically align the steered light beam.

In accordance with yet another aspect of the present invention, an exemplary optical communication apparatus may include a plurality of optical sources, each of the optical sources emitting a light beam, and a micro-electromechanical assembly such as a MEMS structure. The micro-electromechanical assembly may be formed on a transmissive substrate, which could be substantially parallel to a horizontal plane. The micro-electromechanical assembly may include an electrostatic comb drive actuator having an array of micro-lenses with each of the micro-lens corresponding to each of the optical sources for focusing the respective light beams to couple the micro-electromechanical assembly to the plurality of optical sources for steering the light beams.

The electrostatic comb drive actuator may include one or more fixed combs, each having a first set of fingers, and one or more movable combs, each having a second set of fingers which may be in an interdigitated arrangement with the first set of fingers. The movable combs may be displaced within the horizontal plane in response to an actuating potential being applied to the electrostatic comb drive actuator. The movable combs may include a micro-lens frame to hold an array of micro-lenses and at least one suspension member, each suspension member attached at a first end to the micro-lens frame and at a second end to the transmissive substrate, thereby suspending the micro-lens frame substantially parallel to the horizontal plane.

In accordance with another aspect of the present invention, an exemplary optical communication apparatus may include an optical signal sensing device corresponding to each of the optical sources for tracking the respective steered light beams such that optical signal sensing devices may provide a feedback signal corresponding to each of the optical sources to dynamically align the respective steered light beams.

In accordance with yet another aspect of the present invention, an exemplary method for optical communication may include the steps (a) receiving an optical input at a transmissive micro-optical element integrated with a micro-electromechanical assembly such as a MEMS structure; and (2) positioning the transmissive micro-optical element to steer the optical input received at the transmissive micro-optical element in a first transmission direction in response to a first actuating force such as a first voltage bias applied to the micro-electromechanical assembly for displacing the transmissive micro-optical element. The method may further include the step (c) steering the optical input received at the transmissive micro-optical element in a second transmission direction in response to a second actuating force such as a second voltage bias applied to the micro-electromechanical assembly.

In accordance with still another aspect of the present invention, an exemplary method for optical communication may include the steps (a) generating a light beam from an optical source, the light beam directed to a micro-lens integrated with a micro-electromechanical assembly such as a MEMS structure; (b) deriving from passing the light beam through a first major surface of the micro-lens a focused light beam; (c) applying an actuating force to the micro-electromechanical assembly for displacing the micro-lens in a first direction within a horizontal plane to steer the focused light beam; (d) receiving from a second major surface of the micro-lens a steered light beam directed to an optical detector in response to the actuating force applied to the micro-electromechanical assembly, wherein the second major surface of the micro-lens is disposed opposite to the first major surface; and (e) coupling the steered light beam to the optical detector for providing an optical link through free space between the optical source and the optical detector.

In accordance with still further aspect of the present invention, an exemplary method for fabricating an integrated optical communication apparatus may include the steps (a) forming a micro-electromechanical member such as a MEMS structure having an aperture; (b) forming a substantially transmissive micro-optical element interposed at the aperture to provide a micro-electromechanical optical assembly; (c) releasing the micro-electromechanical optical assembly; and (d) disposing an optical source proximal to the micro-electromechanical optical assembly. The step of forming the micro-electromechanical member may further include the steps (a) forming a first structural material layer over a substrate; (b) forming a sacrificial material layer over the first structural material layer; (c) forming a second structural material layer over the sacrificial material layer; (d) forming an optical polymer material layer having a major surface to fill the aperture; and (e) processing the micro-electromechanical optical assembly for adapting the major surface of the optical polymer material layer into a spherical profile determined through at least one parameter. In addition, the micro-electromechanical member may be formed on a substantially transparent substrate such as glass.

According to one feature of the present invention, a passive alignment of a MEMS lens assembly is provided for enabling an initial alignment of one or more optical sources with respect to associated one or more micro-optical elements. Accordingly, a flip chip module assembly technique is adapted for bonding the MEMS lens assembly to a carrier substrate, which receives the one or more optical sources. Likewise, a dynamic beam steering of one or more light beams generally carrying associated optical signals is provided for enabling an active alignment of the one or more light beams with associated one or more optical detectors. Preferably, a MEMS feedback servo loop can maintain the active alignment.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIGS. 11A–1B illustrate an active alignment of a light beam for the laser optical communicator of FIG. 9B.

DETAILED DESCRIPTION

Figure 1A:
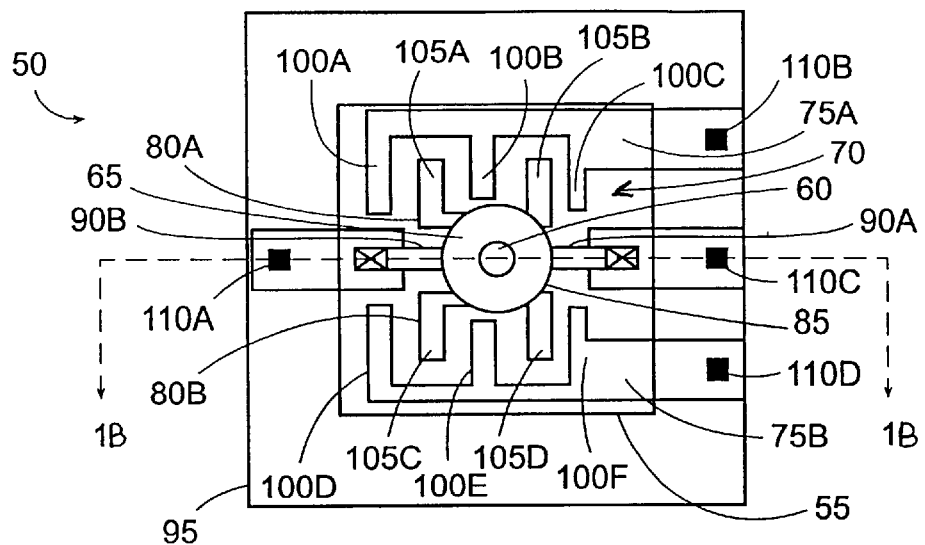
FIG. 1A shows a top plan view of an exemplary embodiment of a micro-electromechanical systems (MEMS) integrated micro-lens assembly (IMLA) in accordance with the present invention.

A significant step in constructing solid state optical communication systems is integrating micro-optics directly with micro-electromechanical systems (MEMS). The present invention is generally directed to such integration of micro-optics with micro-electromechanical systems (MEMS) actuators to provide desired micro-optical communication devices for realizing a variety of optical communication systems. The preferred embodiment of the present invention is generally described with respect to a MEMS lens assembly, which may include a transmissive micro-optical element, which can be readily integrated with an actuator such as a comb drive actuator. In exemplary embodiment, silicon micro-fabrication technology is generally employed to fabricate such chip-scale or miniature devices of the present invention. For example, optical MEMS may be advantageously integrated with one or more transmissive micro-optical elements. And such integrated optical MEMS may be advantageously implemented utilizing an improved micro-fabrication process. The present invention should, however, not necessarily be restricted to the field of such transmissive micro-optical elements and/or a comb drive actuator, as will be readily evident. Like reference numerals refer to similar elements throughout the drawings.

Figure 1B:
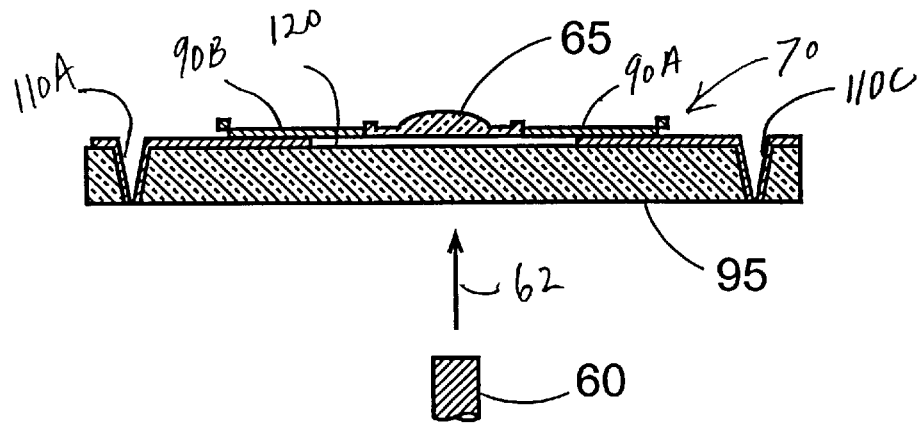
FIG. 1B shows a cross-sectional view of FIG. 1A taken along line 1B—1B.

FIG. 1A shows a top plan view of an exemplary embodiment of a MEMS integrated micro-lens device 50 in accordance with one aspect of the present invention, hereinafter referred to as the optical MEMS 50. FIG. 1B shows a cross-sectional view of FIG. 1A taken along line 1B—1B. With reference to FIGS. 1A and 1B, optical MEMS 50 may comprise a MEMS lens assembly 55, which may optically link an optical source 60 to a receiver such as an optical detector (not shown). Optical source 60 may provide a light beam 62 to generally carry an optical signal for a desired communication in an optical communication system. MEMS lens assembly 55 may include a micro-lens 65, which is generally, interposed between the optical source 60 and the optical detector. The MEMS lens assembly 55 may further include a MEMS comb drive actuator 70 to selectively micro-position the micro-lens 65 in response to an actuating force which is being applied to MEMS comb drive actuator 70.

MEMS comb drive actuator 70 may comprise first and second fixed combs 75A, 75B, and first and second movable combs 80A, 80B. Movable combs 80A and 80B may include a frame 85 to hold the transmissive micro-optical element, micro-lens 65. MEMS comb drive actuator 70 further may include suspension members 90A and 90B, each suspension member 90A and 90B may fixedly connect at a first end to the frame 85 and at a second end to a carrier substrate 95, thereby suspending the frame 85. First and second fixed combs 75A, 75B may include a first set of fingers 100A through 100F. More specifically, as shown in FIG. 1A, fixed comb 75A may include fingers 100A through 100C and fixed comb 75B may include fingers 100D through 100F. Likewise, movable combs 80A and 80B may include a second set of fingers 105A through 105D. In particular, movable combs 80A and 80B may include fingers 105A, 105B and fingers 105C, 105D, respectively. The second set of fingers 105A through 105D may be in an inter-digit arrangement with the first set of fingers 100A through 100F. To couple MEMS comb drive actuator 70 to carrier substrate 95, anchors 110A through 110D may be used.

In an exemplary embodiment, anchors 110A through 110D may form connections or contacts between a MEMS comb drive actuator layer and a carrier substrate layer using conductive vias, cuts, or just vias. It is to be understood that generally most micro-fabrication processes allow such contacts or vias to be used to connect two or more layers without much restrictions or special arrangements. Therefore, as persons skilled in the art will appreciate that anchors 110A through 110D may be devised using any suitable arrangements or interconnects available in a micro-fabrication process employed to synthesize MEMS lens assembly 55.

Micro-lens 65 may receive to substantially focus or collimate light beam 62 generally directed towards MEMS lens assembly 55. As carrier substrate 95 may receive an optical signal from optical source 60 for optically coupling MEMS lens assembly 55 to optical source 60. In one embodiment, MEMS lens assembly 55 may be fixedly connected to optical source 60. In addition, MEMS lens assembly 55 is suspended in a plane, as an example, the plane could be a horizontal plane with the MEMS lens assembly 55 being substantially perpendicular to the optical source 60.

In operation, optical source 60 may emit light beam 62 generally directed towards MEMS lens assembly 55 that may be formed on carrier substrate 95. In order to provide a desired displacement of micro-lens 65 for aligning light beam 62 with the receiver, movable combs 80A and 80B may be displaced, in response to an actuating force, such as an actuating potential or voltage, being generally applied to MEMS comb drive actuator 70. As known in the art, MEMS comb drive actuator 70 responsive to an electrostatic charge between first set of fingers 100A through 100F and second set of fingers 105A through 105D may provide the desired displacement of micro-lens 65. For example, a voltage bias can be applied across a particular set of the interdigitated fingers 100A through 100F and 105A through 105D generating an electrostatic force therebetween. In response to the voltage bias being applied, the movable combs 80A and 80B may be either pushed away from the first set of fingers 100A through 100F or pulled toward the first set of fingers 100A through 100F. Such application o f the voltage bias to a particular set of the interdigitated fingers 100A through 100F and 105A through 105D generally determines the direction in which movable combs 80A and 80B moves micro-lens 65 upon actuation.

More specifically, in an exemplary embodiment, responsive to a first voltage bias applied between movable comb 80A and fixed comb 75A, an electrostatic force may drive the movable comb MEMS structure generally comprising movable combs 80A and 80B towards fixed comb 75A. This first voltage bias controlled displacement may enable selective positioning of micro-lens 65. In this manner, micro-lens 65 can be micro-positioned within the horizontal plane with respect to carrier substrate 95. Thus, MEMS comb drive actuator 70 is operable for selectively steering the micro-lens 65 formed light beam 62.

However, it is to be understood that the micro-positioning of micro-lens 65 for enabling the excursions thereof in the horizontal plane responsive to the applied actuating force such as an electrostatic force to comb drive actuator 70 as shown in FIG. 1A are exemplary only, and the scope of the present invention should not be limited by the contemplated horizontal plane excursions of micro-lens 65 through the shown MEMS comb drive actuator 70. For example, there is no limitation that a particular MEMS actuator be employed. Additionally, excursions of the micro-lens 65 in first and second directions responsive to a corresponding first and second actuating forces can vary without departing from the scope of the present invention. Moreover, MEMS lens assembly 55 can be associated with optical source 60 for micro-positioning micro-lens 65 in a particular plane without departing from the scope of the present invention and optical MEMS 50 may be implemented using a variety of suitably configured MEMS actuators known to those skilled in the art.

Referring to FIG. 1B illustrates carrier substrate 95 with MEMS lens assembly 55 mounted thereon. Micro-lens 65 may be spaced proximal to carrier substrate 95 for light beam 62 from optical source 60 to pass therethrough as indicated by the propagation arrow directed to the optical detector (not shown). MEMS lens assembly 55 having MEMS comb drive actuator 70 generally extends upwardly from carrier substrate 95 to thereby define a recess 120 over which MEMS comb drive actuator 70 may be suspended. A relatively small gap or recess 120 generally separates MEMS comb drive actuator 70 from carrier substrate 95, typically may be few microns such as 10 microns. Carrier substrate 95 may be a transmissive substrate, such as glass or quartz or an opaque substrate with a hole etched into it.

Referring now to FIGS. 1A and 1B, as described below, optical MEMS 50 may be devised to precisely position micro-lens 65, such as during micro-positioning operations for optical communication from an optical transmitter to an optical receiver to manipulate one or more optical signals for switching, and/or for a spatial alignment of an optical fiber with a laser diode or other optical elements. In an exemplary embodiment, optical MEMS 50 generally includes micro-lens 65 and MEMS comb drive actuator 70 disposed in a fixed position relative to carrier substrate 95. And MEMS comb drive actuator 70 suspended over at least a portion of carrier substrate 95. While MEMS comb drive actuator 70 and micro-lens 65 can be hybrid or monolithic structure that is fabricated over the same substrate. Moreover, micro-lens 65 and MEMS comb drive actuator 70 could be two separate elements that are disposed in a fixed relation to one another. In this regard, MEMS comb drive actuator 70 may be releasably patterned and deposited over carrier substrate 95. Anchors 110A through 110D and suspension members 90A and 90B may be formed of a suitable conductive material such as a metal. As known to those skilled in the art, anchors 110A through 110D are generally separated from MEMS comb drive actuator 70 and carrier substrate 95 by means of a dielectric layer, such as silicon nitride, in order to electrically isolate anchors 110A through 110D from MEMS comb drive actuator 70 and carrier substrate 95, or the anchors are formed on an insulating substrate. Additionally, contact pads can be typically formed of a conductive material, such as a metal, as extensions of respective ones of suspension members 90A and 90B. As such, in an exemplary embodiment, electrical contact can be established to MEMS comb drive actuator 70 with the contact pads via suspension members 90A and 90B.

While the illustrated embodiment of MEMS comb drive actuator 70 is an uni-directional comb drive (vertical or y-direction) having a generally rectangular shape, MEMS comb drive actuator 70 can have other shapes without departing from the spirit and scope of the present invention. Regardless of the shape of MEMS comb drive actuator 70, however, appropriate supports such as suspension members 90A and 90B can be disposed adjacent to sides of MEMS comb drive actuator 70. For a bi-directional MEMS comb drive actuator, four pairs of fixed and movable combs with each pair comprising a fixed and an associated movable comb may be configured to provide the micro-lens 65 a selective displacement in either x-direction (along horizontal axis) or y-direction (along vertical axis). In this configuration, the four fixed combs (for example, two horizontal and two vertical) can be suitably anchored, and the four movable combs could be inter-linked. A desired displacement in x-direction of the inter-linked combs can be achieved by applying a voltage between the two fixed horizontal combs and the associated inter-linked movable combs. Similarly, applying a voltage between the two-fixed vertical combs and the associated inter-linked movable combs can achieve a desired displacement in y-direction.

FIGS. 2A–2G illustrate side elevational views of optical MEMS 50 in one embodiment of a manufacturing process for MEMS-Lens integration embodying one aspect of the present invention which may be used to fabricate optical MEMS 50 of FIG. 1A. Such manufacturing process generally utilizes carrier substrate 95 as the working surface on which multiple, alternating layers of material are selectively deposited. Such manufacturing process may use three main types of materials, including but not limited to, a structural material, a sacrificial material, and an optical material. The structural material may make up the operational structure including MEMS lens assembly 55 (without micro-lens 65) and MEMS comb drive actuator 70. The sacrificial material may be used to produce the spaces and gaps for the MEMS structure including recess 120. The optical material may provide micro-optics structure, including micro-lens 65. The sacrificial material can be removed through conventional chemical processes at the end of the manufacturing process to release the MEMS structure. Such layering of structural, sacrificial, and optical materials could provide movable, suspended, or interlocked levels. In one embodiment, glass may be used for carrier substrate 95. Other suitable materials may be employed, however, such as quartz, ceramic or silicon.

Figure 2A:
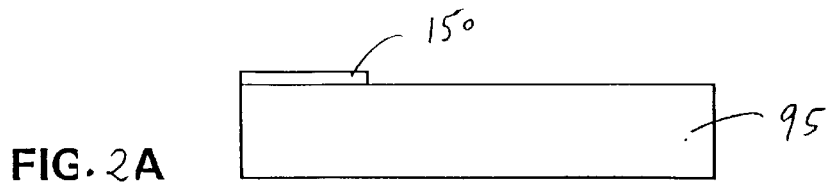
FIGS. 2A–2G illustrate one embodiment of fabrication process steps leading to the construction of the MEMS integrated micro-lens assembly (IMLA) of FIG. 1A.
Figure 2B:
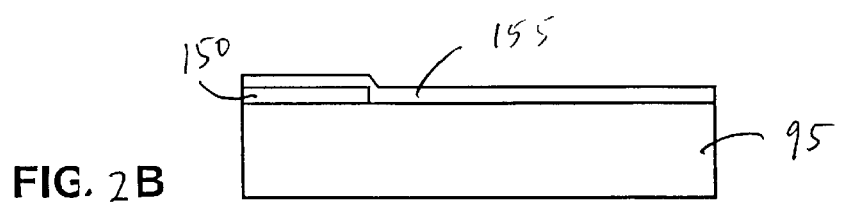
Figure 2C:
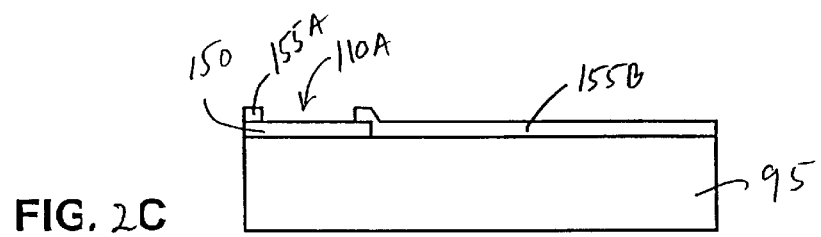

As shown in FIGS. 2A–2D, using micro-fabrication technology to generally build optical MEMS 50, the manufacturing process for MEMS-Lens integration may begin with a first conductive layer 150. First conductive layer 150 may be patterned over carrier substrate 95, in process step 1, generally employing known lithography deposition techniques. For example, first conductive layer 150 may be patterned lithographically using standard integrated circuit fabrication technology, such as resist lift-off or resist definition and etch. In process step 2, as depicted in FIG. 2B, a sacrificial layer 155 may be deposited, employing generally known sacrificial layer techniques. As depicted in FIG. 2C, via 110A may be etched in process step 3.

Figure 2D:
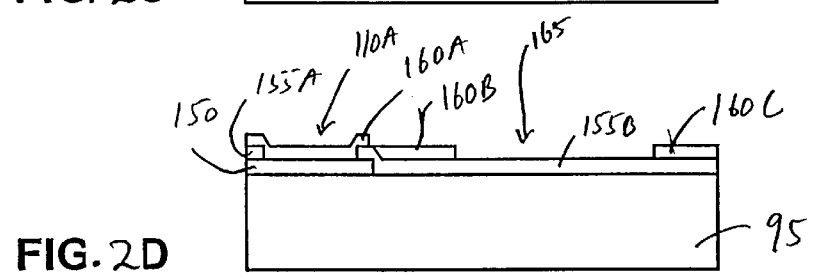

In process step 4, as illustrated in FIG. 2D, a second layer 160 may be patterned and deposited employing generally known lithography and deposition techniques to provide layer portions 160A through 160C. As shown in FIG. 2C, sacrificial layer 155 may be formed on top of the conductive layer 150 and carrier substrate 95 and may be etched to provide portions 155A and 155B so that MEMS lens assembly 55 may be produced above sacrificial layer 155. Via 110A may be etched in sacrificial layer 155 to expose layer 150. Via 110A definition may be determined using conventional resist lithography and etching of sacrificial layer 155. The significant characteristics of sacrificial layer 155 are a high etch rate, good thickness uniformity, and conformal coating by sacrificial layer 155 of first conductive layer 150 already deposited on carrier substrate 95.

In process step 4, FIG. 2D also shows the fabrication of MEMS lens assembly 55 including the fabrication of MEMS comb drive actuator 70. The material used for the second conductive layer 160 preferably have a low etch rate compared to sacrificial layer 155 so that second conductive layer 160 may not etched away when sacrificial layer 155 is removed to release MEMS lens assembly 55. A lens frame 165 may be patterned and formed into second conductive layer 160. Lens frame 165 may provide an opening or aperture in which micro-lens 65 may be later formed.

Figure 2E:
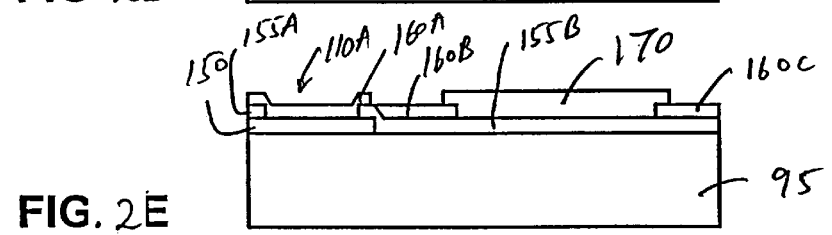
Figure 2F:
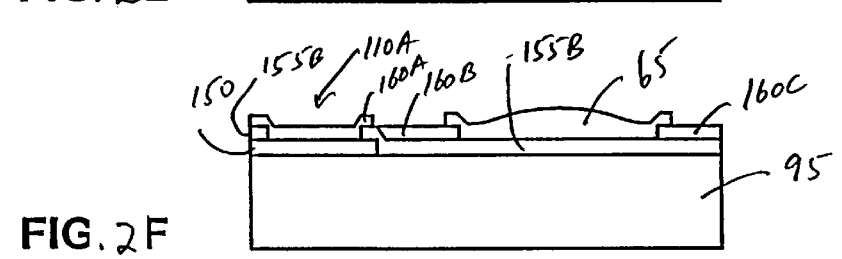
Figure 2G:
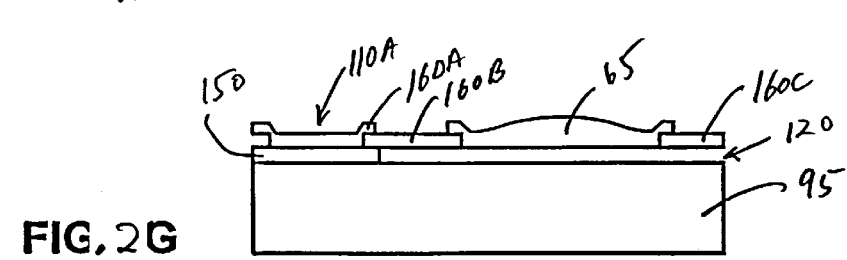

FIGS. 2E–2G depict process steps 5 through 7 for fabricating micro-lens 65. In process step 5, as shown in FIG. 2E, a starting layer of lens-polymer 170 may be patterned and applied. For example, lens disk lithography can be employed for the process step 5 to pattern and apply lens-polymer layer 170 of a desired thickness such as in the range of few microns to couple of tens of microns. The processed carrier substrate 95 of FIG. 2E may be placed in an oven, in process step 6, where heat may cause the lens-polymer or film of lens-polymer layer 170 to reflow. By controlling the viscosity level during the process step 6, lens-polymer layer 170 can be adapted to form a spherical micro-lens 65 of a desired curvature or a desired spherical profile. The heated carrier substrate 95 may be removed from the oven in process step 7, thus generally transforming the lens-polymer layer 170 into the desired spherical profile for micro-lens 65. The processed carrier substrate 95 may then be prepared for the MEMS release process step 7. Sacrificial layer 155 may be removed to release MEMS lens assembly 55, as shown in FIG. 2G. In this manner, first conductive layer 150 in conjunction with second conductive layer 160 may form a suspendable MEMS lens assembly 55. After MEMS lens assembly 55 release, optical MEMS 50 having micro-lens 65 integrated with MEMS comb drive actuator 70 may be ready for further assembly.

Figure 3:
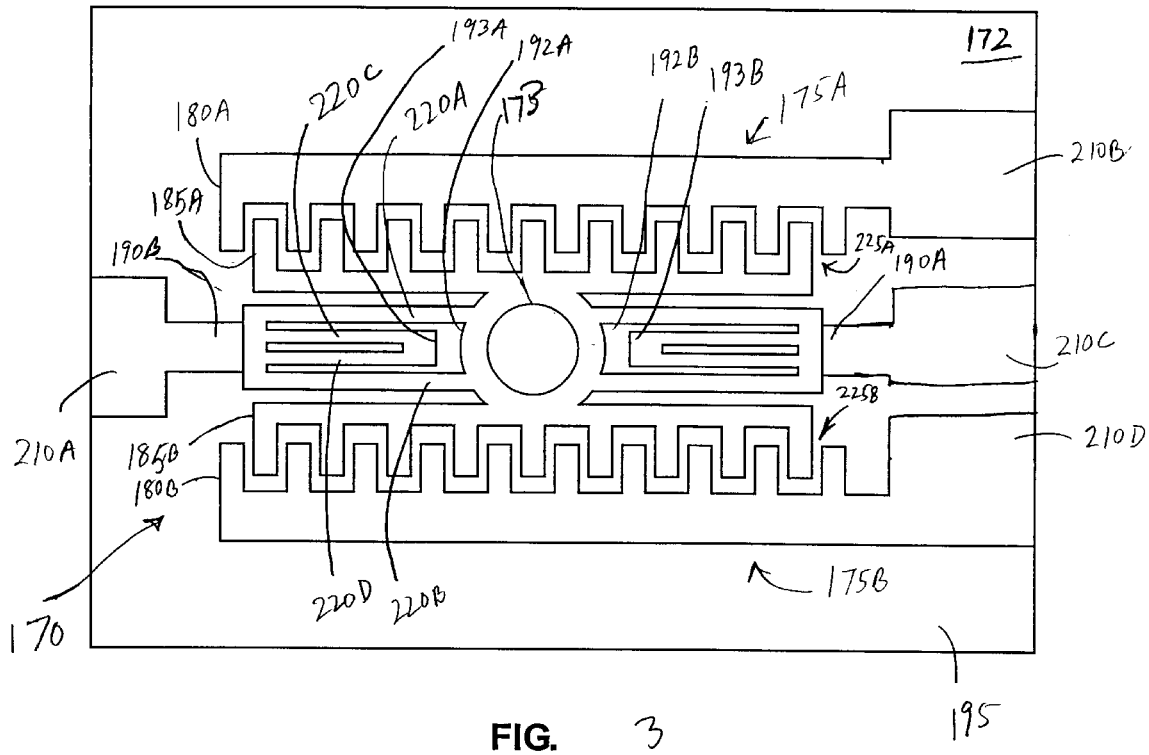
FIG. 3 depicts a top view of a MEMS comb drive actuator consistent with the present invention.

FIG. 3 depicts a top view of a unidirectional MEMS comb drive actuator 170 consistent with one aspect of the present invention. A suspended MEMS lens assembly 172 may comprise a unidirectional MEMS comb drive actuator 170 fabricated with MEMS technology generally utilizing the manufacturing process of FIGS. 2A–2G. Suspended MEMS lens assembly 172 may further comprise a micro-lens frame 173 to receive a transmissive micro-lens.

Unidirectional MEMS comb drive actuator 170 may comprise a first comb drive 175A having a first fixed comb 180A and a first movable comb 185A, and a second comb drive having 175B having a second fixed comb 180B and a second movable comb 185B. As shown in FIG. 3, in one embodiment, both first and second comb drives 175A and 175B may be identical. Micro-lens frame 173 may be advantageously integrated with first movable comb 185A and second movable comb 185B to hold the transmissive micro-lens. Unidirectional MEMS comb drive actuator 170 may further include suspension members 190A and 190B, each suspension member, 190A and 190B, for fixedly connecting at a respective first end, 192A and 192B to the micro-lens frame 173. And at a respective second end, 193A and 193B to a substrate 195, thereby suspending the MEMS lens assembly 172. Suspension members 190A and 190B may be in a folded beam configuration. For example, arms 220A and 220B may project in an opposite direction as opposed to arms 220C and 220D.

To couple unidirectional MEMS comb drive actuator 170 to substrate 195, anchors 210A through 210D may be utilized. However, it should be appreciated that suspension members 190A and 190B may be configured differently to provide support for and electrical contact with first and second comb drives 175A and 175B. As shown in FIG. 3, first comb drive 175A may include a first set of interdigitized fingers 225A and second comb drive 175B may include a second set of interdigitized fingers 225B. For example, the first set of interdigitized fingers 225A could include nineteen fingers with each finger having 10 microns of width and generally interposed at 8 microns in separation from the adjacent finger. Moreover, released second conductive layer 160 could be 3.5 microns in thickness.

In operation, unidirectional MEMS comb drive actuator 170 may selectively micro-positions the transmissive micro-lens in response to an actuating force such as an electrostatic force being applied to unidirectional MEMS comb drive actuator 170 through an actuation voltage. When an actuation voltage is placed across either the first or second set of interdigitized fingers 225A, 225B, an electrostatic charge may be generated therebetween. In turn, first and second movable combs 185A and 185B may be displaced. For example, when the first comb drive 175A may be actuated, first movable comb 185A may be pulled towards the first fixed comb 180A. In one embodiment, actuation voltage of 50 Volts is used for providing a maximum displacement of 5 microns.

The present invention, in one aspect, may provide MEMS integrated micro-optical communication devices. For example, in an exemplary MEMS integrated micro-optical communication device, a MEMS lens assembly may include micro-optics, which may be advantageously integrated with a MEMS actuator. In one embodiment, according to one aspect consistent with the present invention, the MEMS lens assembly may be integrated with a micro-optical element to form a focused light beam. With the MEMS actuator, the focused light beam may be directed into a steered light beam in order to operate the MEMS integrated micro-optical communication device. Such a MEMS integrated micro-optical communication device may further comprise an optical source coupled to the MEMS lens assembly for receiving an optical signal indicative of optical information in an optical communication system.

According to one aspect of the present invention, the present invention is generally directed to seamless fabrication and integration of micro-optics with a MEMS structure. Such fabrication and integration may provide a MEMS integrated micro-optical communication device as a building block for a variety of optical communication systems. A MEMS integrated micro-optical communication device may include at least one micro-optical element such as a micro-lens for forming a light beam and a MEMS comb drive actuator for selectively steering the formed light beam. Alternatively, an array of micro-optical elements such as an array of micro-lenses could be included. Processing steps are also provided for monolithically fabricating the MEMS lens assembly and the MEMS integrated micro-optical communication device.

In an exemplary embodiment, a transmissive micro-optical element such as a refractive micro-lens is integrated with a MEMS comb drive actuator to form a MEMS lens assembly. The MEMS comb drive actuator may be fabricated on a transparent substrate using low stress deposition techniques. And a refractive micro-lens may be integrated monolithically with the MEMS comb drive actuator. In accordance with one aspect of the present invention, a MEMS lens assembly may be further integrated with an optical source generally providing a light beam for a MEMS integrated micro-optical communication device. The light beam generally carries an optical signal being emitted from the optical source for a desired optical communication. The refractive micro-lens may focus the light beam to provide a focused or collimated light beam.

In an exemplary optical communication method consistent with one aspect of the present invention, the MEMS comb drive actuator may steer the focused light beam into a steered or aligned light beam, responsive to an actuation force by selectively micro-positioning the refractive micro-lens. Such selective micro positioning of the refractive micro-lens may cause optically coupling of the steered light beam with a receiver having at least one optical detector. The actuation force for steering the focused light beam may be an electrostatic force providing continues position control of the refractive micro-lens.

In one embodiment, an opto-electro-mechanical transmitter may include a vertical cavity surface-emitting laser (VCSEL) integrated with a MEMS lens assembly hating a micro-lens coupled to a MEMS comb drive actuator. Alternatively, a VCSEL array may be combined with a MEMS lens assembly having a corresponding array of micro-lenses coupled to a MEMS comb drive actuator. The VCSEL may provide an optical input to the micro-lens for forming a focused light beam. The MEMS comb drive actuator, in response to an applied actuation force such as an electrostatic force, may selectively micro-position the micro-lens relative to the VCSEL for steering the focused light beam into an optical link to enable a desired optical connection. For a laser communication system, the MEMS comb drive actuator may align the optical link to an appropriate laser detector or optical receiver.

In accordance with one aspect of the present invention, a passive alignment of MEMS lens assembly 172 may be provided for enabling an initial alignment of one or more optical sources with respect to associated one or more micro-optical elements. Accordingly, a flip chip module assembly technique may be adapted for bonding the MEMS lens assembly to a carrier substrate, which may receive the one or more optical sources.

Figures 4A, 4B:
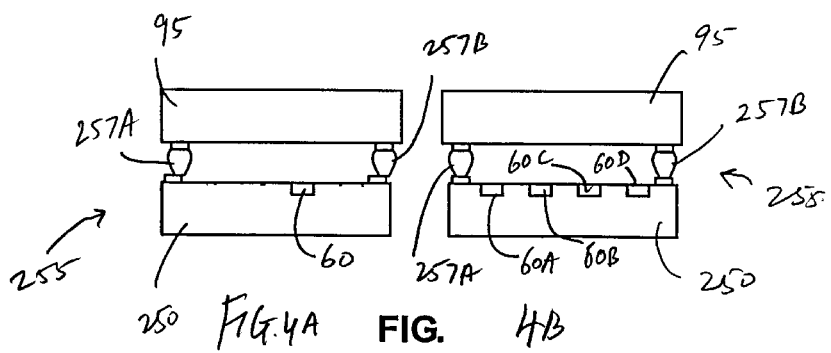
FIGS. 4A–4B show side views for a passive alignment of the MEMS-IMLA of FIG. 1A attached to a host assembly within a flip-chip assembly.

FIGS. 4A–4B show side views embodying a passive alignment of the MEMS integrated micro-lens device 50 of FIG. 1A fabricated over carrier substrate 95 attached to a host assembly 250 to form a flip chip assembly 255. Host assembly 250 is generally included for imparting one or more optical sources thereon. In one embodiment, host assembly 250 may include optical sources 60A through 60D.

Solder blocks 257A and 257B may bond carrier substrate 95 to host assembly 250.

After the MEMS release process of FIG. 2G, carrier substrate 95 of optical MEMS 50 can be generally assembled such as in a face down fashion or face up fashion using a conventional flip chip process, onto host assembly 250 having a VCSEL or VCSEL array as optical sources 60A through 60D into flip chip assembly 255. Such flip chip assembly 250 may advantageously provide an interconnect between optical MEMS 50 and the VCSEL or VCSEL array, and/or may provide means for self-alignment between optical MEMS 50 and host assembly 250. For example, solder blocks 257A and 257B may bond carrier substrate 95 with host assembly 250 with an approximate accuracy of ±5 μm. As shown in FIGS. 4A–4B, using a reflow process the molten solder may from solder blocks 257A and 257B to cause centering of the bonded components of flip chip assembly 255 to approximately self align within ±1.5 μm. For example, in one embodiment, a flip chip attachment process employs a no-clean flux and a reducing atmosphere during the reflow process. Accordingly, with these two agents, an optically clean flip chip attachment with self-alignment to ±1.5 μm may be devised. For flip chip assembly 255, there may be sufficient tolerance (±10 μm alignment range) to compensate for residual assembly misalignments. As described above, such MEMS/VCSEL flip chip assembly 255 may further can be hermetically sealed using a ceramic package with a transmissive lid.

Figure 5A:
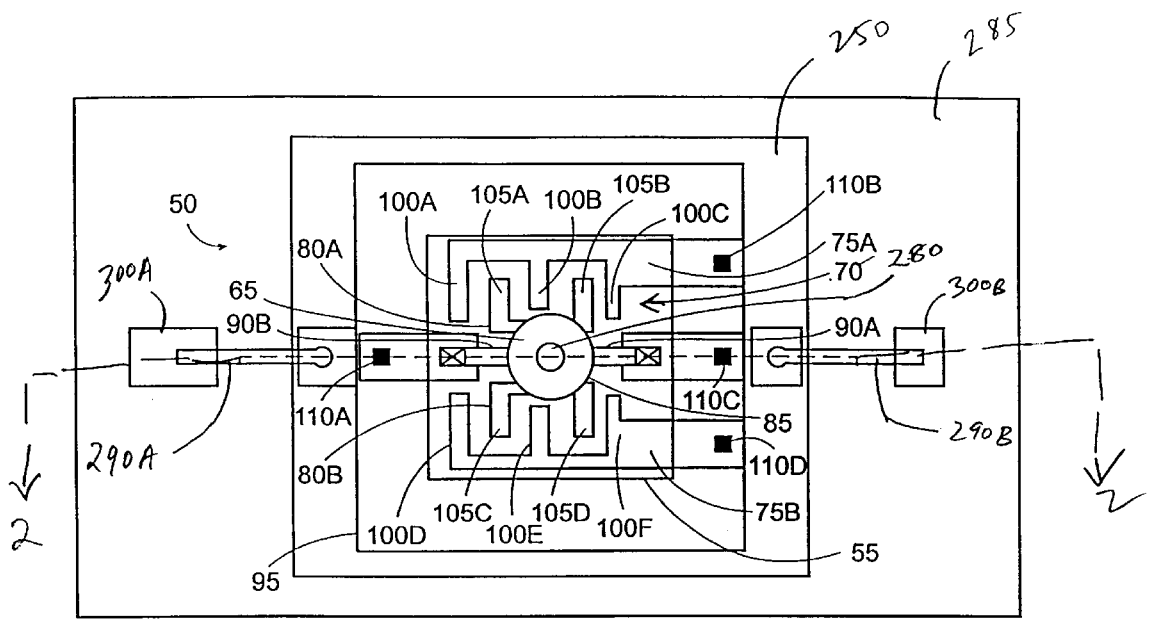
FIG. 5A shows a top plan view of an embodiment of a MEMS integrated micro-optical communication device consistent with the present invention.
Figure 5B:
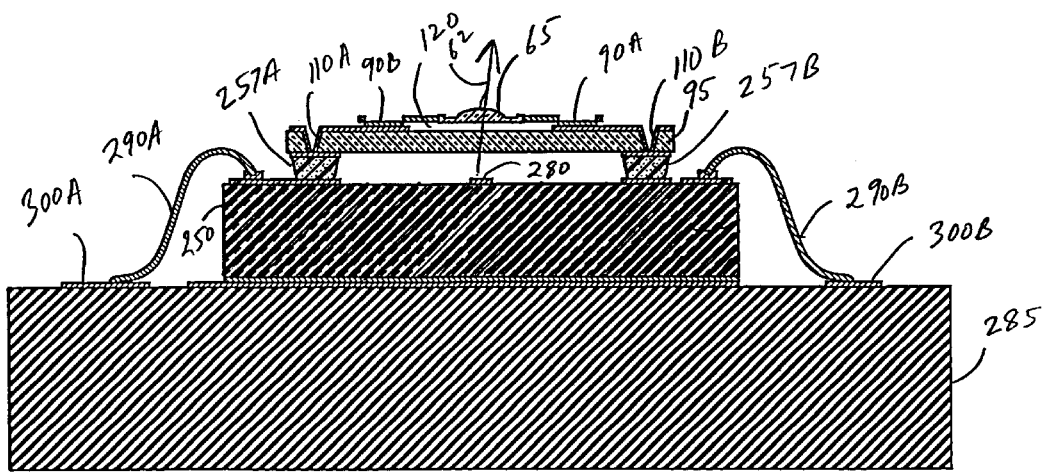
FIG. 5B shows a cross-sectional view of FIG. 5A taken along line 2—2.

FIG. 5A shows a top plan view of an embodiment of a MEMS integrated micro-optical communication device 275 consistent with one aspect of the present invention, hereinafter referred to as an opto-electro-mechanical (OEM) transmitter 275. FIG. 5B shows a cross-sectional view of FIG. 5A taken along line 2—2.

With reference to FIGS. 5A and 5B, in one embodiment, OEM transmitter 275 may include a vertical cavity surface-emitting laser (VCSEL) 280 integrated with optical MEMS 50 comprising MEMS lens assembly 55 having micro-lens 65 and MEMS comb drive actuator 70. VCSEL 280 may provide an optical source to micro-lens 65 for forming a focused light beam such as through light beam 62 which generally carries an optical signal for a desired communication in a laser communication system. Optical MEMS 50 may be further integrated with a ceramic substrate 285. In particular, optical MEMS 50 may comprise carrier substrate 95 having MEMS lens assembly 55 mounted thereon with solder blocks 257A and 257B for bonding carrier substrate 95 to host assembly 250. Host assembly 250 may receive VCSEL 280. Host assembly 250 may be wire bonded to ceramic substrate 285. More specifically, conductive wires 290A and 290B may connect to associated and suitably disposed wire contact pads 300A and 300B generally disposed over ceramic substrate 285.

As described earlier, optical MEMS 50 may include micro-lens 65 and MEMS comb drive actuator 70, which may be disposed in a fixed position relative to carrier substrate 95. And MEMS comb drive actuator 70 may be suspended over at least a portion of carrier substrate 95. MEMS comb drive actuator 70 may be releasably patterned and formed over carrier substrate 95.

In operation, optical MEMS 50 may micro-position micro-lens 65. Such micro-positioning operations may provide for an optical communication from OEM transmitter 275 to a suitable optical receiver (not shown). For example, optical signals from VCSEL 280 can be manipulated for switching and/or for alignment of VCSEL 280 to other optical elements such as optical detectors generally included in the suitable optical receiver to enable laser communications. More specifically, MEMS comb drive actuator 70, in response to an applied actuation force such as an electrostatic force, may selectively micro-position micro-lens 65 relative to VCSEL 280 for steering the focused light beam. For a laser communication system, MEMS comb drive actuator 70 may align the steered light beam to an appropriate laser detector or the suitable optical receiver (not shown).

Figure 6:
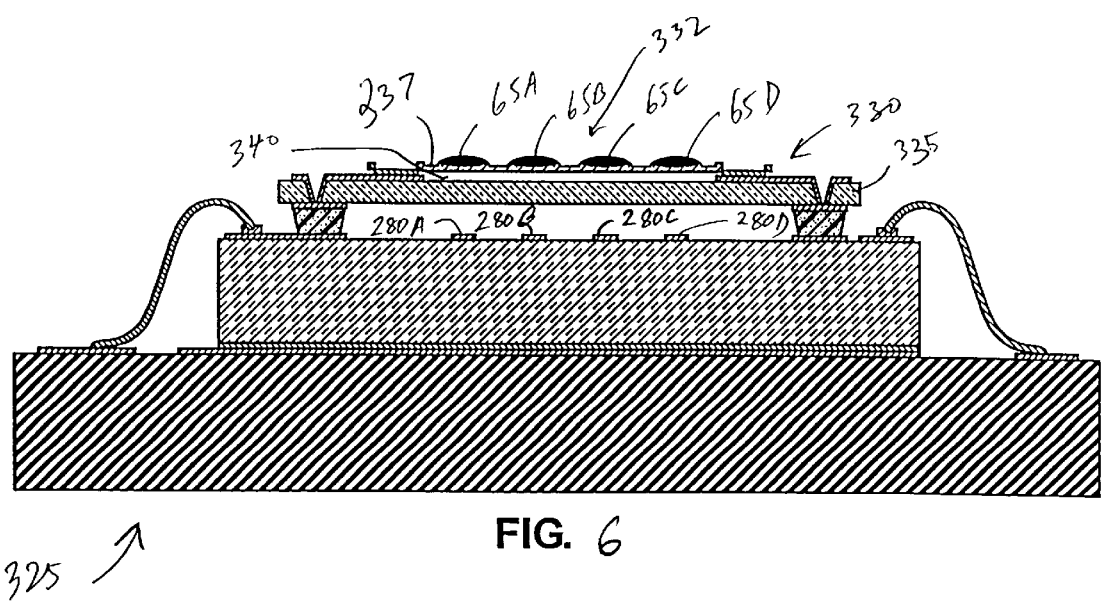
FIG. 6 shows a side elevational view, in cross-section of an alternate embodiment of a MEMS integrated micro-optical communication device in accordance with one aspect of the present invention.

FIG. 6 shows a side elevational view, in cross section of an alternate embodiment of a MEMS integrated micro-optical communication device 325 in accordance with one aspect of the present invention, hereinafter referred to as an OEM transmitter array 325. OEM transmitter array 325 may comprise an array optical MEMS 330 having a MEMS lens array assembly 332 generally patterned and deposited over at least a portion of an array carrier substrate 335. MEMS lens assembly 332 comprises micro-lenses 65A through 65D and an array MEMS comb drive actuator 337. OEM transmitter array 325 may further comprise an array of VCSELs 280A through 280D integrated with array optical MEMS 330 to associate with respective micro-lenses 65A through 65D.

In one embodiment, OEM transmitter array 325 may further comprise an array of 64 VCSELs. Each VCSEL may emit light to provide a corresponding optical source with an approximate wavelength of 850 nm. Additionally, the VCSEL array may be oxide confined and such emitting structures may be devised to be modulated at frequencies for a particular bandwidth such as bandwidth of 155 Mb/s. Moreover, bandwidth, power output per element, number of elements and array size of VCSEL could be optimized to meet a desired specification for OEM transmitter array 325. For example, with 64 VCSEL elements having 850 nm wavelength with 16 mW power output per element, 1.0 W maximum array output may be provided. Alternatively, an array of VCSELs emitting at the eye-safe approximate wavelength of 1.55 μm having sufficient power and bandwidth for beam steering could be devised.

In an integrated MEMS-Lens process, micro-lens array fabrication may occur just prior to the release process. Moreover, such a micro-lens array could be integrated with a corresponding VCSEL array, which can be suitably designed for wire bonding into a hermetic ceramic package with a transparent lid. For example, a VCSEL chip could be devised having flip chip landing pads to provide both the mechanical standoff for positioning a MEMS-Lens array over the VCSEL emitters, and the electrical contact for providing the actuating potential to a MEMS comb drive actuator. In another process the micro-lenses could be manufactured separately out of optically refractive materials such as photo-polymers, glasses, quartz, semiconductors, and assembled to the MEMS actuators before or after release. This assembling could occur at the wafer- or the device-level.

Figure 7:
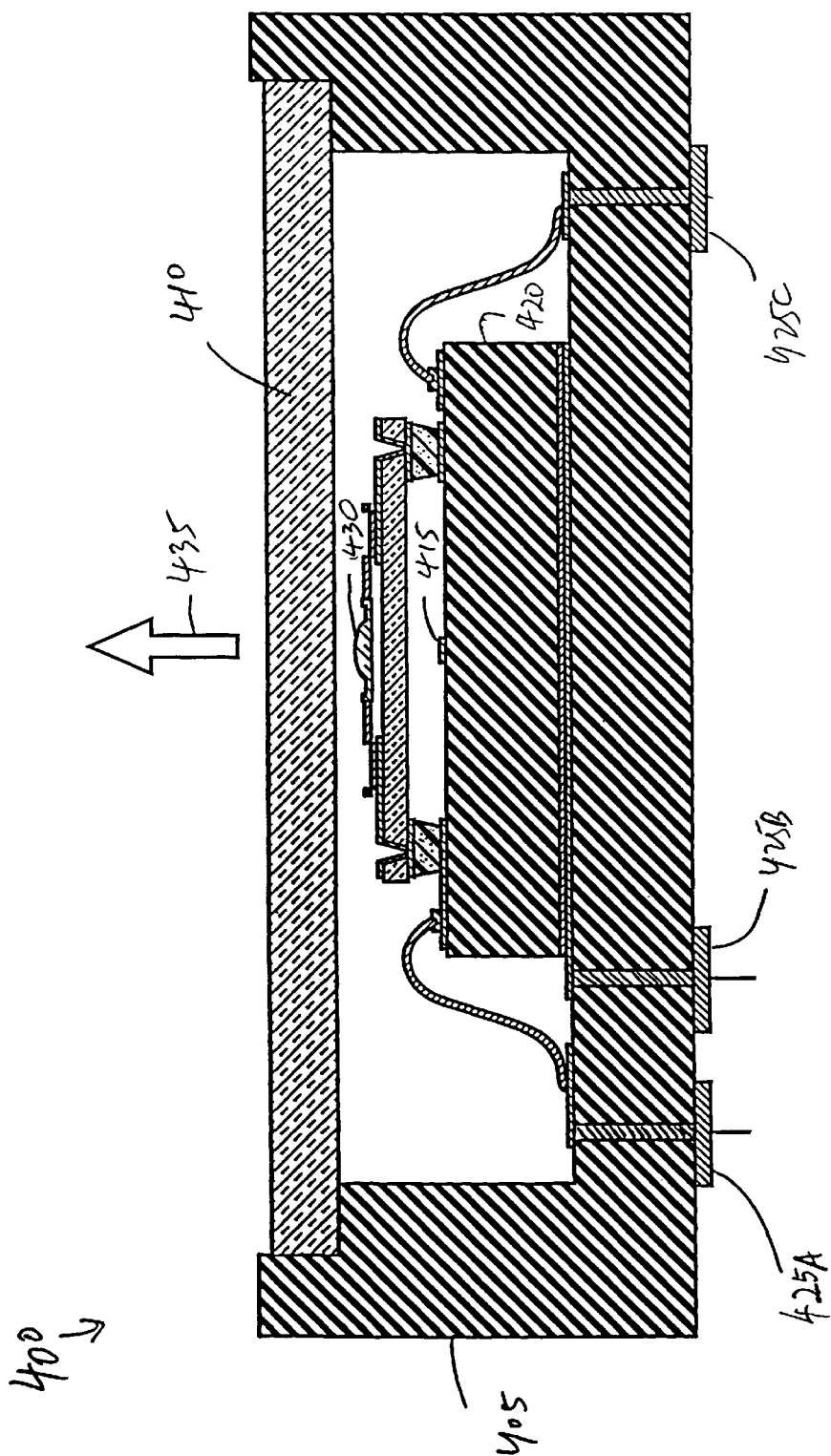
FIG. 7 shows an opto-electromechanical (OEM) transmitter in accordance with the present invention.

FIG. 7 shows a VCSEL MEMS-Lens Array (VMLA) laser beam steering unit 400 in accordance with one aspect of the present invention. VMLA laser beam steering unit 400 may comprise OEM transmitter 325 hermetically sealed in a ceramic package 405 with a transmissive lid 410. Further OEM transmitter 325 may include a VCSEL emitter 415 integrated with a VCSEL chip 420. To operate VMLA laser beam steering unit 400, a MEMS actuator voltage terminal 425A, a VCSEL common terminal 425B, and a VCSEL element bias terminal 425C may be provided. As an example, VCSEL emitter 415 or VCSEL emitter arrays may be devised having each VCSEL emitter emitting approximately ≧1.0 W of optical power at an approximate wavelength of 850 nm. And VCSEL chip 420 having VCSEL emitter 415 or VCSEL emitter arrays may be attached to ceramic package 405 and OEM transmitter 325 by a flip chip assembly process to provide VMLA laser beam steering unit 400. For example, VMLA laser beam steering unit 400 could be less than 5 mm wide, 5 mm long and 1 mm thick. Such VMLA laser beam steering unit 400 can be advantageously employed in applications such as laser communications, reprographics, materials processing, and optical computing interconnects.

In operation, VMLA laser beam steering unit 400 may include a refractive micro-lens 430 to provide laser beam collimating and laser beam steering in a transmission direction 435. Alternatively, a refractive micro-lens array fabrication process compatible with MEMS comb drive fabrication process may be employed to form micro-lenses such as 65A through 65D for such purposes. In one embodiment, an integrated VMLA generally comprises of a MEMS-steered VCSEL laser array for a transmitter module which provides approximately 10° steering range in two axes with approximately 0.5° light beam divergence, and an approximate 1.0 W optical power output that could be modulated at desired data rates including 155 Mbps or more for forming an optical link.

Figure 8:
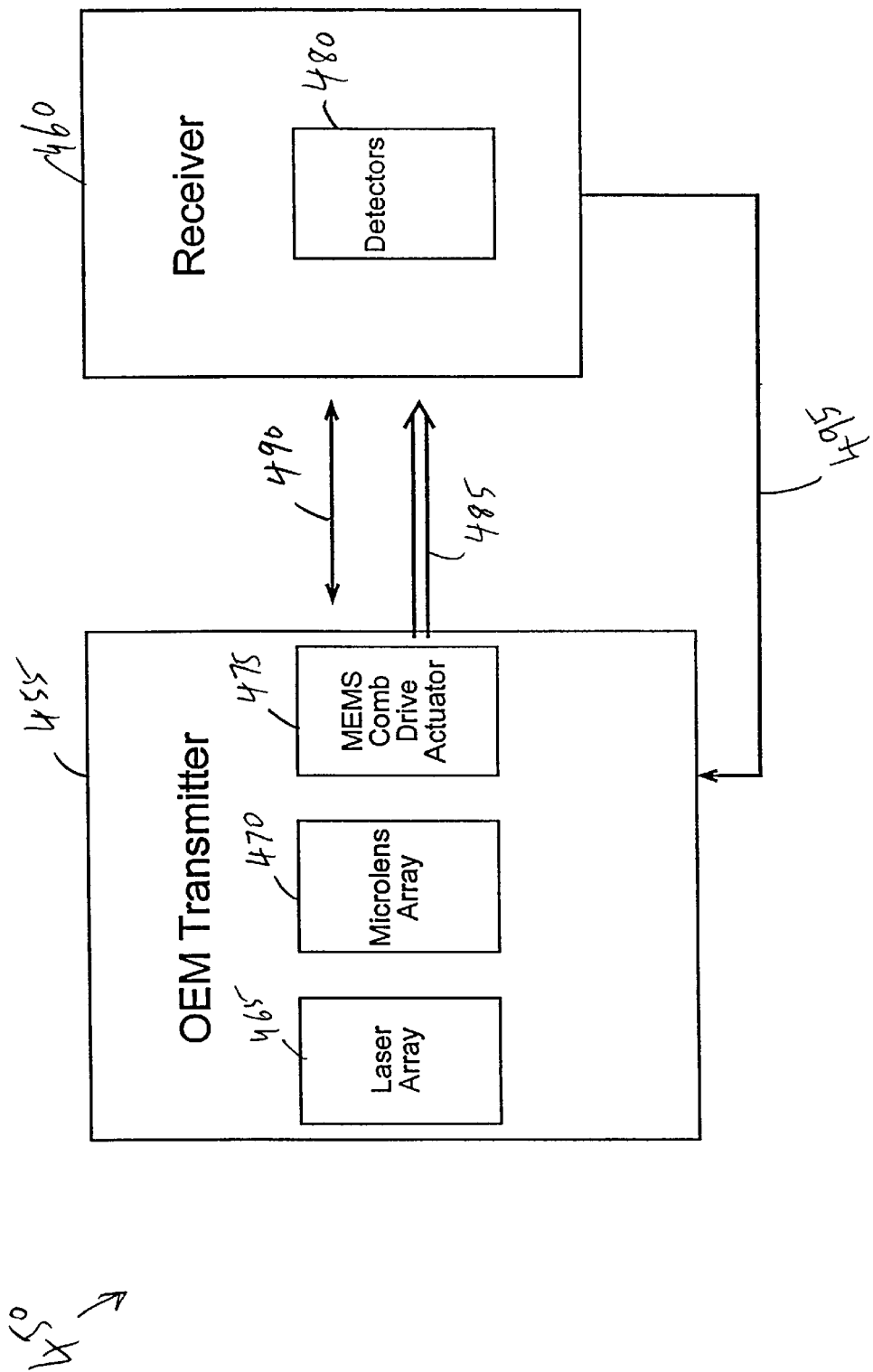
FIG. 8 is a block diagram of an optical communication system consistent with the present invention.

FIG. 8 is a block diagram of an optical communication system 450 consistent with one aspect of the present invention. Optical communication system 450 may comprise a laser OEM transmitter 455 and an associated laser receiver 460. On a transmission end, laser OEM transmitter 455 may include a laser array 465 having a corresponding micro-lens array 470 integrated with a laser MEMS comb drive actuator 475 for providing multi-channel laser communications. Likewise, on a receiving end, laser receiver 460 may include laser detectors 480 for providing free space communications.

A dynamic beam steering of one or more light beams generally carrying associated optical signals may be provided for enabling an active alignment 490 of an optical link 485 with corresponding one or more laser detectors 480. A MEMS feedback servo loop 495 may maintain active alignment 490 between laser OEM transmitter 455 and associated laser receiver 460. For the dynamic beam steering, laser OEM transmitter 455 may adapt optical power output and light beam divergence to changing optical link conditions. However, it should be appreciated that a variety of feedback servo loops are generally known and persons skilled in the art may deploy such a suitable feedback servo loop mechanism for the dynamic beam steering.

In one embodiment, a chip-scale beam steering may enable the implementation of relatively low-cost, compact, and steerable laser communicators or optical MEMS transceivers. Such optical MEMS transceivers generally include transmissive optical elements for collimating a light beam; MEMS actuators to provide an active alignment and light beam steering; VCSEL arrays to generate a high power laser beam; chip-scale integration for a low-profile compact system; a compact, sensitive, multi-channel receiver design for an improved wide-field pointing and tracking. Moreover, a MEMS-Lens integration process may be employed for producing low-loss transmissive micro-lens arrays. Optimizing the lens diameter and shape may provide minimum beam divergence and maximum transmission can be provided using photo-polymer materials or other high performance dielectrics. Diffractive micro-optical elements may be utilized as an alternative to refractive micro-lenses for providing an improved light beam collimating and steering.

Figure 9A:
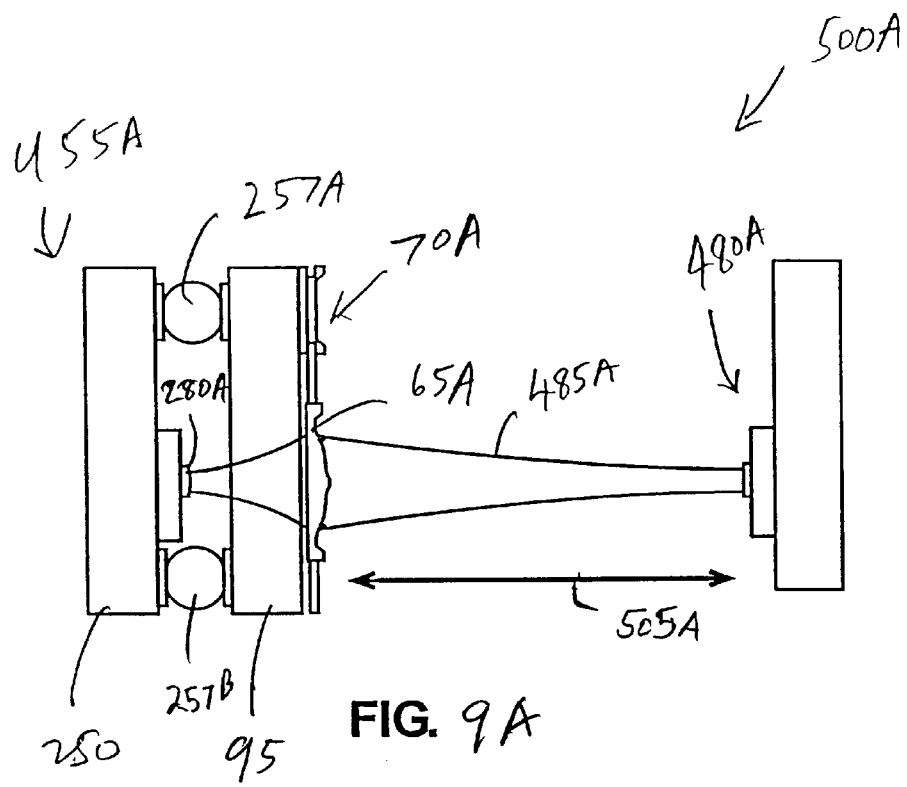
FIG. 9A shows a laser optical interconnect consistent with the present invention.

FIG. 9A shows a laser optical interconnect 500A consistent with one aspect of the present invention. Laser optical interconnect 500A may include a laser OEM transmitter 455A for communicating with an optical interconnect detector 480A. Optical interconnect detector 480A may be disposed in a fixed relation with laser OEM transmitter 455A at an approximate interconnect target spacing 505A of 1 cm thereto. Laser OEM transmitter 455A may include an integrated laser emitter 280A such as a VCSEL. An interconnect MEMS actuator 70A may micro-position a refractive lens 65A, in response to an applied electrostatic force through a bias voltage for steering an optical interconnect link 485A to optical interconnect detector 480A.

Figure 9B:
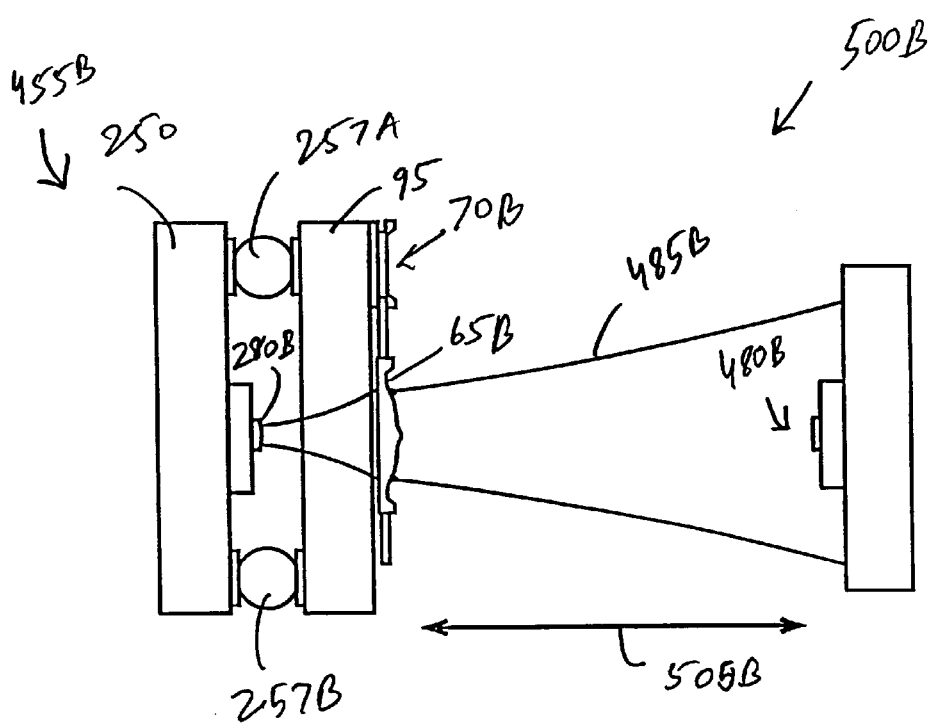
FIG. 9B shows a laser optical communicator consistent with the present invention.

FIG. 9B shows a laser optical communicator 500B consistent with one aspect of the present invention. Laser optical communicator 500B may include a laser OEM transmitter 455B to communicate with an optical communicator detector 480B. Optical communicator detector 480B may be disposed in a fixed relation with laser OEM transmitter 455B at an approximate communicator target spacing 505B of 1 km thereto. Laser OEM transmitter 455B may include an integrated laser emitter 280B such as a VCSEL. A communicator MEMS actuator 70B may micro-position a refractive lens 65B, in response to an applied electrostatic force through a bias voltage for steering an optical communicator link 485B to optical communicator detector 480B.

Figure 10A:
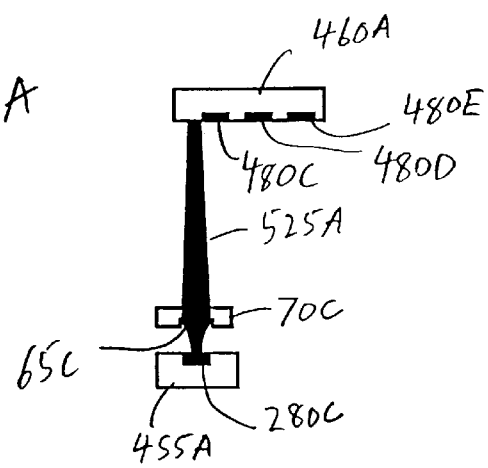
FIGS. 10A–10C illustrate an active alignment of a light beam for the laser optical interconnect of FIG. 9A.
Figure 10B:
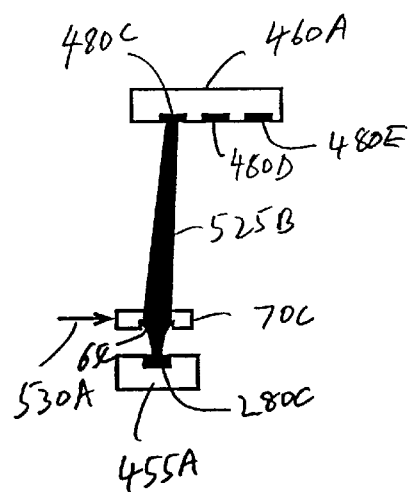
Figure 10C:
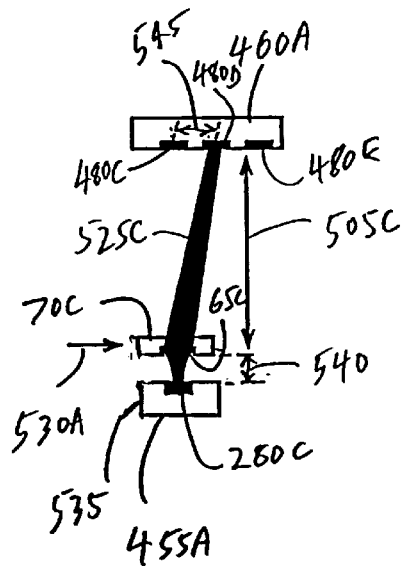

FIGS. 10A–10C illustrate an exemplary active alignment of a free space light beam providing optical data links 525A through 525C for laser optical interconnect 500A of FIG. 9A. As shown in FIG. 10A, a "before alignment" scenario is illustrated for laser OEM transmitter 455A generally having an integrated laser emitter 280C and an optical interconnect receiver 460A generally having optical interconnect detectors 480C through 480E. Optical data link 525A may fail to optically couple laser OEM transmitter 455A to optical interconnect detector 480C in absence of an alignment therebetween. More specifically, a free space MEMS actuator 70C may form the free space light beam having a beam path not substantially aligned with the desired optical interconnect detector 480C. For example, a VCSEL could provide the free space light beam to optically communicate with a 1 mm detector diameter.

Referring to FIG. 10B, an exemplary "after alignment" scenario for laser OEM transmitter 455A and optical interconnect detector 480C is illustrated. As a result of characterization of optical data link 525A, an optical data link 525B may optically couple laser OEM transmitter 455A to optical interconnect detector 480C. Free space MEMS actuator 70C may provide for a desired beam steering to cause a beam path modification according to a desired alignment. By moving refractive lens 65C in a selected direction 530A through free space MEMS actuator 70C, the free space light beam may be steered to optical interconnect detector 480C. Accordingly, optical data link 525A may be characterized into optical data link 525B.

Figure 11A:
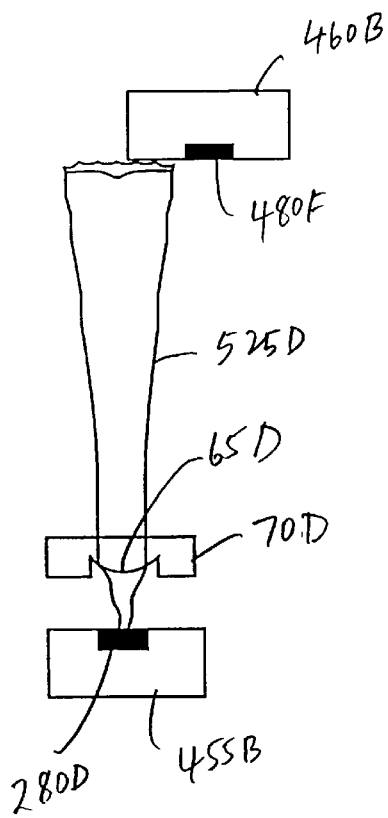
Figure 11B:
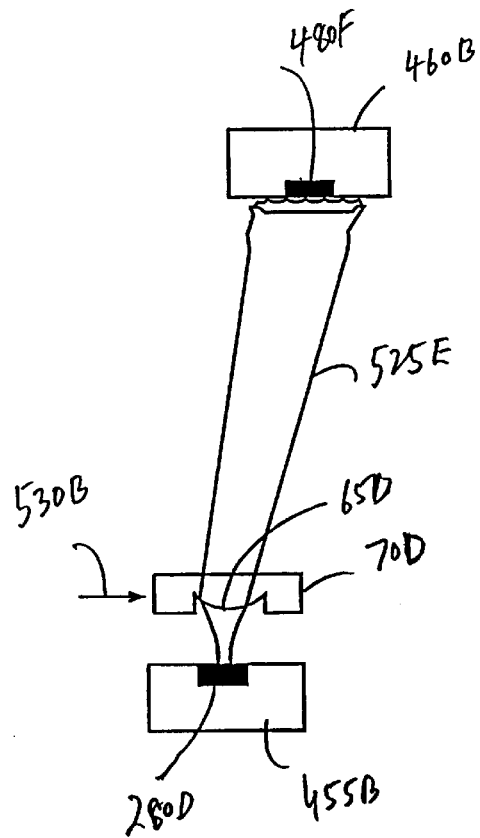

With reference to FIG. 10C, an exemplary "reconfiguration" scenario for laser OEM transmitter 455A and optical interconnect detector 480D is depicted. For a desired reconfiguration of optical data link 525B into an optical data link 525C, free space MEMS actuator 70C may deflect the free space light beam causing the beam path to change. Such deflection may provide a degree of reconfigurability among optical data links 525A through 525C. For example, a displacement 535 of 25 μm in selected direction 530A of free space MEMS actuator 70C may cause micro-positioning of refractive lens 65A generally having a focal length 540 of 250 ∞m. This may provide reconfiguration of optical data link 525B into optical data link 525C through switching from optical interconnect detector 480C to optical interconnect detector 480D generally located spatially apart at an inter detector spacing 545 of 250 ∞m. And laser OEM transmitter 455A may be disposed at an optical interconnect target spacing 505C of 2.5 mm from optical interconnect receiver 460A FIGS. 11A–11B illustrate an exemplary active alignment of a free space light beam providing optical communication links 525D and 525E for laser optical communicator 500B of FIG. 9B. As shown in FIG. 11A, an exemplary "pre-alignment" scenario is illustrated for laser OEM transmitter 455B having an integrated laser emitter 280D and an optical communicator receiver 460B having optical communicator detector 480F. Optical communication link 525D may fail to optically couple laser OEM transmitter 455A to optical communicator detector 480F responsive to a miss alignment therebetween. In particular, a free space optical communication MEMS actuator 70D may form the free space light beam having a optical beam path not substantially aligned with the desired optical communicator detector 480F. Referring to FIG. 10B which depicts an exemplary "post-alignment" scenario for laser OEM transmitter 455A and optical communicator detector 480F. Responsive to a beam steering, optical communication link 525D may switch to provide an optical data link 525E for optically coupling laser OEM transmitter 455A to optical communicator detector 480F. Free space MEMS actuator 70D may enable such a beam steering by micro-positioning a refractive lens 65D in a selected direction 530B. Consequently, the free space light beam may be steered to optical communicator detector 480F.

Figure 12A:
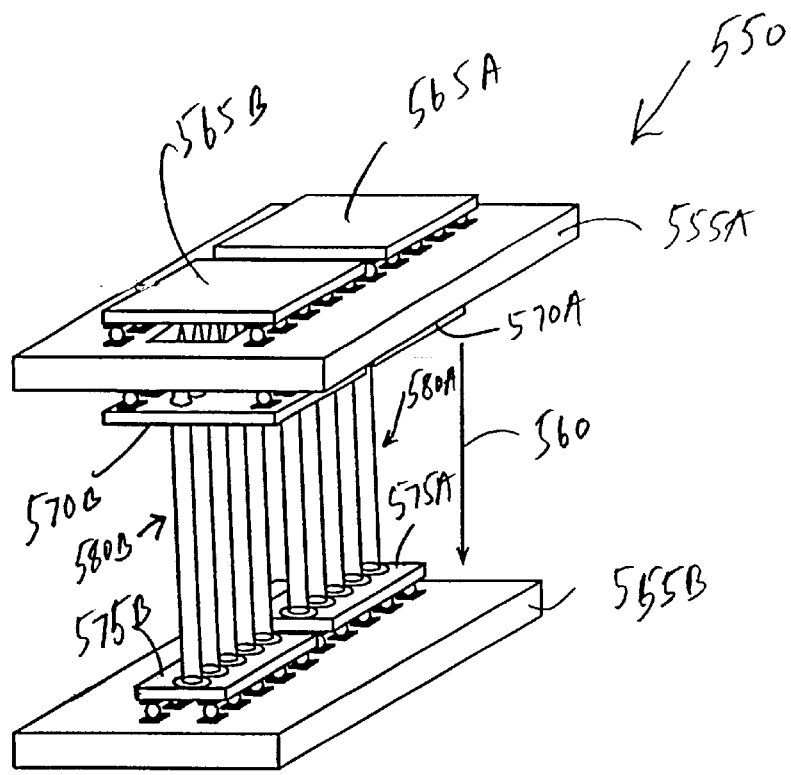
FIG. 12A shows a perspective view of an exemplary laser optical interconnect having vertical cavity surface emitting laser (VCSEL)-MEMS-Lens Array (VMLA) consistent with the present invention.

FIG. 12A shows a perspective view of an exemplary free space laser optical interconnect unit 550 consistent with one aspect of the present invention. Free space laser optical interconnect unit 550 may comprise a first interconnect board 555A and a second interconnect board 555B optically linked through a data path 560. Data path 560 may provide free space optical communication for high-bandwidth interconnects such as multi-gigabit back planes and short-haul cabinet-cabinet communication systems. First interconnect board 555A may include a first VCSEL array 565A and a second VCSEL array 565B integrated with a first opto-MEMS 570A and a second opto-MEMS 570B, respectively. Similarly, second interconnect board 555B may include a first photodiode array 575A and a second photodiode array 575B. First photodiode array 575A may be associated with first opto-MEMS 570A to receive a first set of optical signals 580A. Likewise, second photodiode array 575B may be associated with second opto-MEMS 570B to receive a second set of optical signals 580B.

Figure 12B:
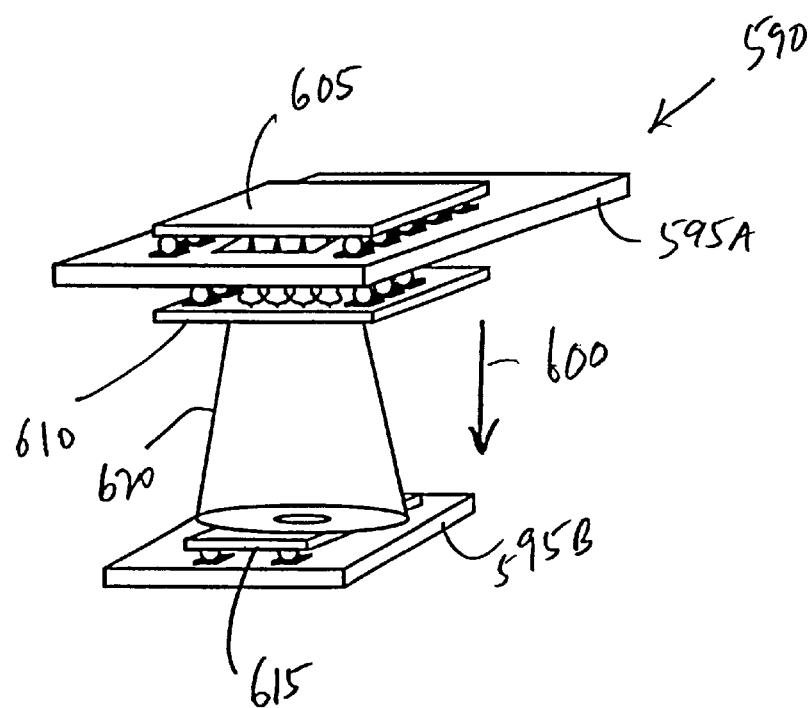
FIG. 12B shows a perspective view of an exemplary laser optical communicator having vertical cavity surface emitting laser VMLA consistent with the present invention.

FIG. 12B shows a perspective view of an exemplary free space laser optical communicator unit 590 consistent with one aspect of the present invention. Free space laser optical communicator unit 590 may comprise a first communicator board 595A and a second communicator board 595B optically linked through a communication path 600.

Communication path 600 generally provides free space optical communication for high-bandwidth optical communications. First communicator board 595A may include a communicator VCSEL array 605 or a laser diode integrated with a communicator opto-MEMS 610. Second communicator board 595B may include a detector photodiode array 615. First photodiode array 575A may be associated with communicator opto-MEMS 610 to receive an optical communication signal 620.

Figure 13:
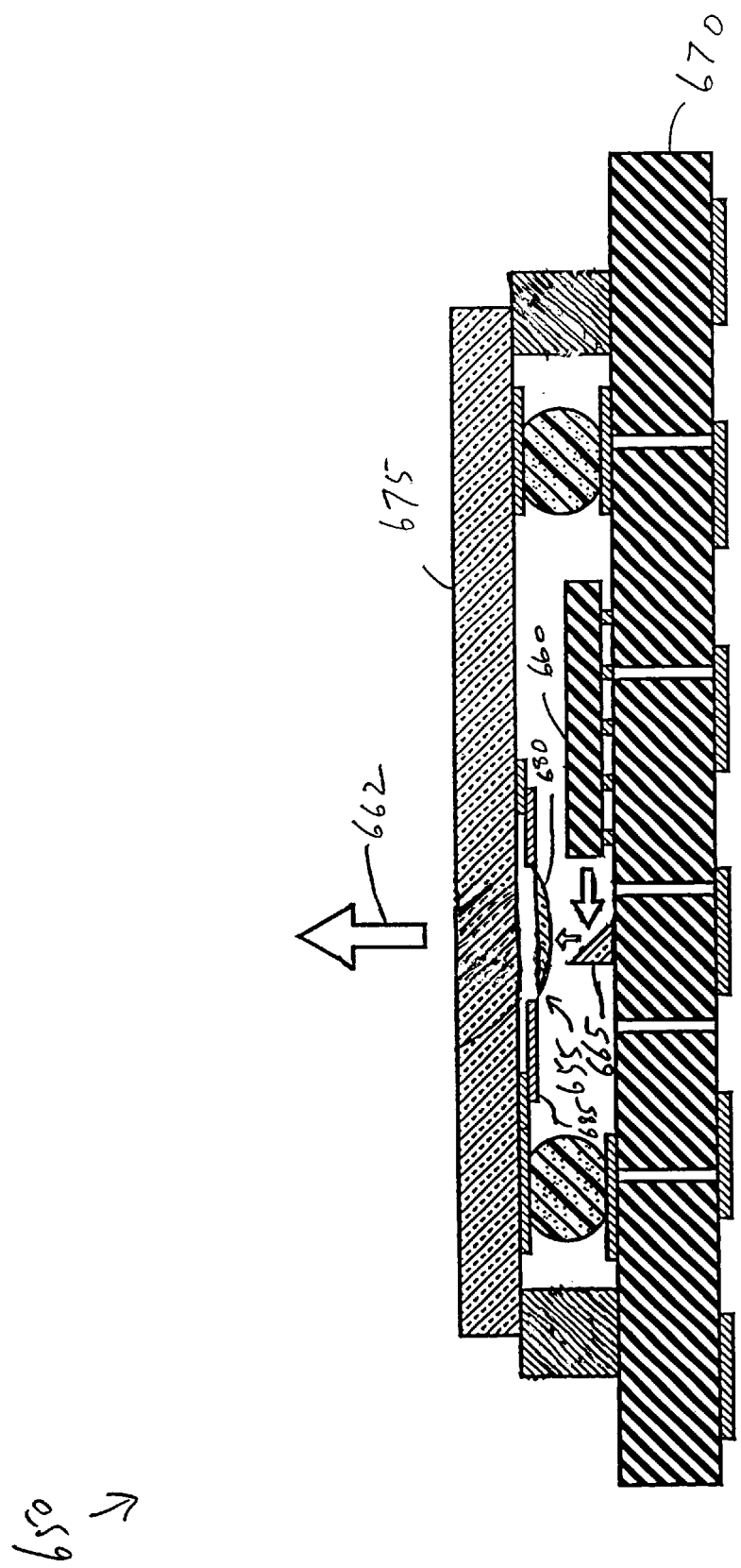
FIG. 13 shows a side elevational view, in cross section of a laser communicator consistent with the present invention.

FIG. 13 shows a side elevational view, in cross section of a laser communicator unit 650 consistent with one aspect of the present invention. Laser communicator unit 650 may comprise an integrated MEMS lens assembly 655 combined with an edge emitting semiconductor laser diode 660. Edge emitting semiconductor laser 660 may provide a light beam 662 generally incorporating optical signals. LASER COMMUNICATOR Laser communicator unit 650 further includes a metallized mirror 665 to manipulate light beam 662 from a first direction to a second direction. Metallized mirror 665 and edge emitting semiconductor laser diode 660 may be coupled to a suitably matched substrate 670. Likewise, integrated MEMS lens assembly 655 could be formed over a transparent substrate 675.

Integrated MEMS lens assembly 655 may include a diffractive micro-lens 680 and an integrated MEMS comb drive actuator 685. Edge emitting semiconductor laser diode 660 may provide an optical source directed to diffractive micro-lens 680 for forming light beam 662. Integrated MEMS comb drive actuator 685, in response to an applied actuation force such as an electrostatic force thereto, may selectively micro-position diffractive micro-lens 680 relative to metallized mirror 665 for free space steering of light beam 662. For an optical communication system, integrated MEMS comb drive actuator 685 may align the steered light beam 662 to a suitable optical detector (not shown).

In operation, diffractive micro-lens 680 may collimate an optical output from edge emitting semiconductor laser diode 660. For a beam steering process, diffractive micro-lens 680 may be mounted directly on integrated MEMS comb drive actuator 685 for micro-positioning diffractive micro-lens 680. Alternatively, a micro-lens array can be mounted onto a MEMS comb drive actuator in close proximity to associated edge emitting laser diodes. Moreover, a dynamic, active alignment of a transmitter by means of a feedback supplied from a receiver (in bi-directional link) could be provided in a laser communication system. Thus, on a transmitter side, the integration of chip-level photonics with the MEMS for appropriately pointing a light beam could allow adaptive optical systems that can be readily realized. Similarly, on a receiver side, a variety of tracking feedback loops compatible with such chip-level photonics may be used for providing a design simplicity, compactness, low cost, and robustness.

Figure 14:
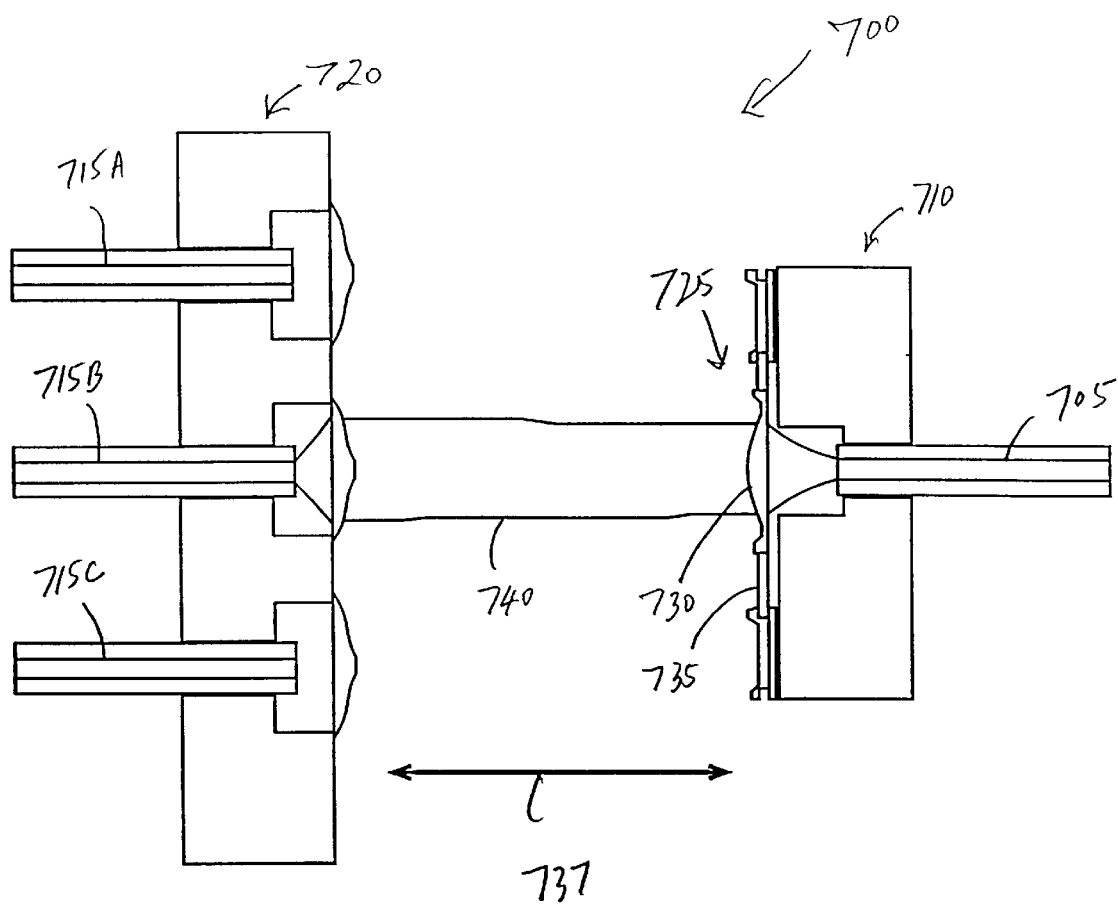
FIG. 14 shows a side elevational view of a fiber optical cross-connect (FOXC) switch consistent with the present invention.

FIG. 14 shows a side elevational view of a fiber optical cross connect (FOXC) switch 700 consistent with one aspect of the present invention. FOXC switch 700 optically couples an input optic fiber 705 of a single-mode fiber unit 710 with one of output optic fibers 715A through 715C from a multi-mode fiber unit 720. For example, input optic fiber 705 may be optically coupled to a first output optic fiber 715A of multi-mode fiber unit 720. Single-mode fiber unit 710 generally comprises a cross connect MEMS lens assembly 725 having a micro-optic lens 730 integrated with a cross connect MEMS comb drive actuator 735. In an exemplary embodiment, single-mode fiber unit 710 may be disposed at an approximate inter-fiber unit spacing 737 of 1 cm from multi-mode fiber unit 720 to form a combined Fiber MEMS-Lens Assembly (FMLA).

In operation, input optic fiber 705 may provide an optical source to micro-optic lens 730 for forming a focused light beam 740 generally carrying an optical signal being transmitted through input optic fiber 705. Cross connect MEMS comb drive actuator 735, in response to an applied actuation force such as an electrostatic force, may selectively micro-position micro-optic lens 730 relative to input optic fiber 705 for steering focused light beam 740. By appropriately micro positioning micro-optic lens 730 relative to input optic fiber 705, the steered light beam 740 may be optically coupled to a detector unit such as multi-mode optic fiber unit 720. This generally enables a selective optical communication in FOXC switch 700 of an optical interconnect system. Such FOXC switch 700 may provide scalability, non-blocking, low loss, and low cross talk and/or wavelength and bit-rate transparency.

Figure 15A:
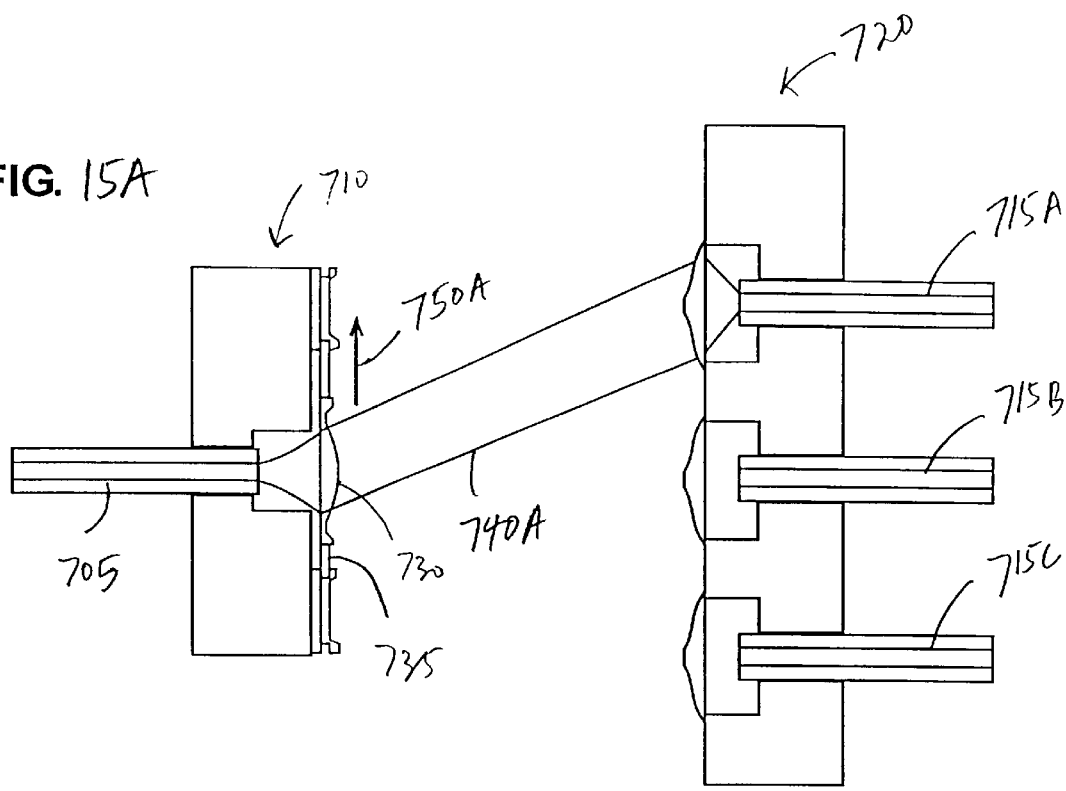
FIGS. 15A–15B illustrate an active alignment of a light beam for the fiber optical cross-connect switch of FIG. 14.
Figure 15B:
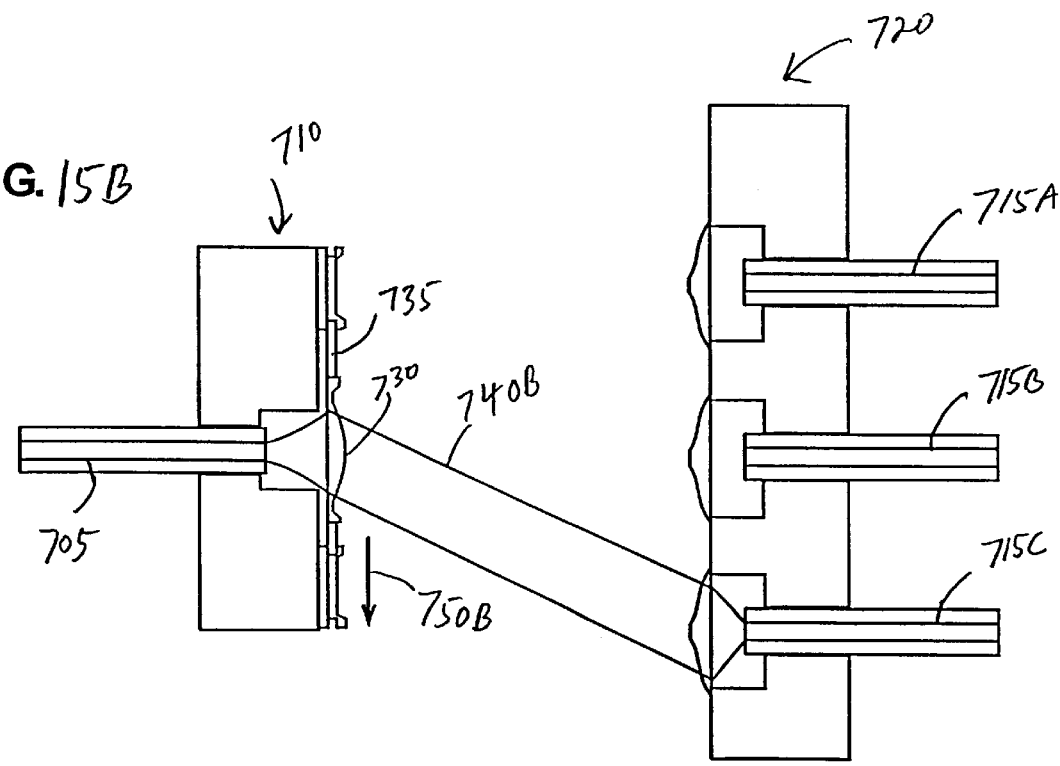

FIGS. 15A–15B illustrate an exemplary active alignment of focused light beam 740 for the FOXC 700 switch of FIG. 14. As shown in FIG. 15A, cross connect MEMS comb drive actuator 735 may move micro-optic lens 730 in a first selected direction 750A for beam steering the focused light beam 740A. Such beam steering can provide an optical link between input optic fiber 705 and output optic fiber 715A. Conversely, as depicted in FIG. 15B, cross connect MEMS comb drive actuator 735 may move micro-optic lens 730 in a second selected direction 750B for beam steering focused light beam 740B. Such beam steering can provide an optical link between input optic fiber 705 and output optic fiber 715C. FOXC switch 700 can be advantageously utilized in a variety of applications, including but not limited to high bandwidth interconnect for high performance computer systems, re-configurable crossbar interconnect for high bandwidth applications, steerable optical communication systems, and all-optical fiber crossbar switch. By controllably actuating cross connect MEMS comb drive actuator 735, input optic fiber 705 carried by single-optic fiber can then be precisely aligned with a selected one of output optic fibers 715A through 715C or other optical element. Although the foregoing alignment process is described above in conjunction with the alignment of an optical fiber, the MEMS positioning apparatus in one aspect of the present invention can align a variety of other objects in a similar manner.

It should be understood that apertures may be suitably devised in single-mode fiber unit 710 and multi-mode fiber unit 720 for providing access to input optic fiber 705 and output optic fibers 715A through 715C, respectively. In an exemplary embodiment, such apertures, which have a diameter typically in the range of about 50 to 100 nanometers (nm), could be formed by drawing down the tip of an optical fiber by known methods. According to one such method, tension is placed on the fiber, and the fiber is heated locally with a focused laser spot. As the fiber heats it begins to flow and separates into two pieces with finely tapered ends. Metal may be then deposited at the tapered fiber ends, leaving a small opening at the tip.

The foregoing describes only one embodiment of the invention and many variations of the embodiment will be obvious for a person skilled in the art of semiconductor, micro-electromechanical fabrication. Certainly, various other materials and techniques can be utilized in the construction of the various layers.

Although the present invention and its advantages have been described in detail, it should be understood that various changes, substitutions and alterations can be made to the embodiments herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. An integrated optical apparatus, comprising:
   a micro-electromechanical member formed on a substantially transparent substrate;
   a substantially transmissive micro-optical element coupled to the micro-electromechanical member; and
   an actuator for positioning said substantially transmissive micro-optical element;
   wherein said positioning is caused in a first displacement direction substantially coplanar to a major surface of said micro-electromechanical member in response to a first actuating force; and
   wherein said positioning is caused in a second displacement direction substantially coplanar to a major surface of said micro-electromechanical member in response to a second actuating force, the second displacement direction being substantially perpendicular to the first displacement direction.

2. The apparatus of claim 1, said substantially transmissive micro-optical element comprising a micro-lens.

3. The apparatus of claim 1, wherein said micro-electromechanical member is substantially coplanar to said substantially transmissive micro-optical element.

4. The apparatus of claim 1, said substantially transmissive micro-optical element collimating an optical output to form a light beam.

5. The apparatus of claim 1, the positioning being determined by an actuating force profile.

6. The apparatus of claim 1, at least one of said actuating forces being an applied voltage bias.

7. The apparatus of claim 1, wherein said actuator is a comb drive actuator formed on a substrate.

8. The apparatus of claim 7, the comb drive actuator comprising:
   one or more fixed combs; and
   one or more movable combs fixed to said substantially transmissive micro-optical element and being displaced in response to the at least one actuating force.

9. The apparatus of claim 8, the comb drive actuator further comprising:
   at least one suspension member, each suspension member operably connected at a first end to the one or more movable combs and at a second end to the substrate, thereby suspending the one or more movable combs.

10. The apparatus of claim 1, wherein said positioning is caused in a third displacement direction coplanar to a major surface of said micro-electromechanical member responsive to a concurrent application of the first and second actuating forces.

11. A method of fabricating an integrated optical apparatus, comprising:
   forming a micro-electromechanical member having an aperture; and
   forming a substantially transmissive micro-optical element interposed at the aperture to provide a micro-electromechanical optical assembly;
   wherein forming said micro-electromechanical member includes:
   forming a first structural material layer over a substrate;
   forming a sacrificial material layer over the first structural material layer; and
   forming a second structural material layer over the sacrificial material layer.

12. The method of claim 11, wherein forming said integrated optical apparatus includes:
   releasing said micro-electromechanical optical assembly.

13. The method of claim 11, wherein forming said substantially transmissive micro-optical element includes:
   forming an optically refractive material layer having a major surface to fill said aperture; and
   processing said micro-electromechanical optical assembly for adapting the major surface of said optical material layer into a surface profile determined through at least one parameter.

14. The method of claim 11, wherein said micro-electromechanical member is formed on a substantially transparent substrate.

15. The method of claim 14, wherein said substantially transparent substrate is glass or quartz.

16. A method of fabricating an integrated optical apparatus, comprising:
   forming a micro-electromechanical member having an aperture;
   separately forming a substantially transmissive micro-optical element; and
   assembling the micro-electromechanical member with the micro-optical element;
   wherein forming said micro-electromechanical member includes:
      forming a first structural material layer over a substrate;
      forming a sacrificial material layer over the first structural material layer; and
      forming a second structural material layer over the sacrificial material layer.

17. The method of claim 16, wherein forming said substantially transmissive micro-optical element includes:
   forming an optically refractive material layer having a major surface; and
   processing said micro-electromechanical optical assembly for adapting the major surface of said optical material layer into a surface profile determined through at least one parameter.

18. The method of claim 16, wherein said micro-electromechanical member is formed on a substantially transparent substrate.

19. An optical communication apparatus, comprising:
   an optical source to emit a light beam; and
   a micro-electromechanical assembly coupled to the optical source and having a photo-polymer micro-lens to receive the light beam for focusing and selective steering thereof.

20. The apparatus of claim 19, the micro-electromechanical assembly further comprising:
   a comb drive actuator formed on a substrate to selectively position the transmissive micro-optical element in response to an actuating force applied to said comb drive actuator.

21. The apparatus of claim 19, wherein the micro-electromechanical assembly is formed on a transparent substrate.

22. The apparatus of claim 19, wherein the optical source is a laser diode.

23. The apparatus of claim 19, wherein the optical source is a fiber.

24. The apparatus of claim 19, wherein the optical source is a vertical cavity surface emitting laser diode.

25. The apparatus of claim 19, wherein the optical source is an edge emitting laser diode.

26. The apparatus of claim 20, the comb drive actuator further comprising:
   one or more fixed combs; and
   one or more movable combs being displaced in response to the actuating force, said one or more movable combs including a frame to hold said transmissive micro-optical element and at least one suspension member, each suspension member operably connected at a first end to the frame and at a second end to the substrate, thereby suspending said one or more movable combs.

27. The apparatus of claim 21, wherein the micro-electromechanical assembly comprises support layers.

28. The apparatus of claim 21, wherein the transmissive micro-optical element is coplanar with a major surface of the micro-electromechanical assembly.

29. The apparatus of claim 26, wherein the actuating force is an electrostatic force.

30. An optical communication apparatus, comprising:
   a plurality of optical sources, each of the optical sources emitting a light beam; and
   a micro-electromechanical assembly having a photo-polymer micro-lens corresponding to each of the optical sources for focusing and steering respective light beams received at the corresponding transmissive micro-optical elements.

31. The apparatus of claim 30, the micro-electromechanical assembly further comprising:
   a comb drive actuator formed on a substrate to selectively position the transmissive micro-optical elements in response to an actuating force applied to said comb drive actuator.

32. The apparatus of claim 30, wherein said light beams are steered to provide respective steered light beams for an active alignment, the active alignment dynamically aligns the respective steered light beams in a selected direction in response to the actuating force.

33. The apparatus of claim 30, wherein the micro-electromechanical assembly is formed on a transparent substrate.

34. The apparatus of claim 30, wherein the optical sources comprise a laser diode array.

35. The apparatus of claim 30, wherein the optical sources comprise a fiber array.

36. The apparatus of claim 30, wherein the optical sources comprise a vertical cavity surface emitting laser diode array.

37. The apparatus of claim 30, wherein the optical sources comprise an edge emitting laser diode array.

38. The apparatus of claim 30, wherein each said optical source comprises an input fiber disposed in a fiber optical cross connect switch.

39. The apparatus of claim 38, the micro-electromechanical assembly performs beam switching of the respective light beams received at the associated input fibers to optically link the received respective light beams to a corresponding output fiber of a plurality of output fibers disposed substantially facing said input fibers of the fiber optical cross connect switch.

40. The apparatus of claim 31, the comb drive actuator further comprising:
   one or more fixed combs; and
   one or more movable combs being displaced in response to the actuating force, wherein said one or more movable combs include a frame to hold said transmissive micro-optical elements and at least one suspension member, each suspension member attached at a first end to the frame and at a second end to the substrate, thereby suspending said one or more movable combs.

41. The apparatus of claim 32, wherein a spatial alignment for each of the steered light beams is maintained by a corresponding feedback control loop.

42. The apparatus of claim 33, wherein the micro-electromechanical assembly comprises support layers.

43. The apparatus of claim 33, wherein said transmissive micro-optical elements are coplanar with a major surface of the micro-electromechanical assembly.

44. The apparatus of claim 40, wherein the actuating force is an electrostatic force.

45. An optical communication apparatus, comprising:
an optical source to emit a light beam;
a micro-electromechanical assembly coupled to the optical source and including a movable drive actuator having a transmissive micro-optical element for focusing and selectively steering the light beam; and
an optical signal sensing device for tracking the steered light beam, the optical signal sensing device providing a feedback signal to dynamically align the steered light beam.

46. An optical communication apparatus, comprising:
a plurality of optical sources, each of the optical sources emitting a light beam;
a micro-electromechanical assembly coupled to said plurality of optical sources and including a movable drive actuator having a transmissive micro-optical element corresponding to each of the optical sources for focusing and selectively steering the respective light beams; and
an optical signal sensing device corresponding to each of the optical sources for tracking the respective steered light beams, the optical signal sensing devices providing a feedback signal corresponding to each of the optical sources to dynamically align the respective steered light beams.

47. A method for fabricating an integrated optical communication apparatus, comprising:
forming a micro-electromechanical member having an aperture by:
forming a first structural material layer over a substrate;
forming a sacrificial material layer over the first structural material layer;
forming a second structural material layer over the sacrificial material layer;
forming an optical polymer material layer having a major surface to fill said aperture; and
processing said micro-electromechanical optical assembly for adapting the major surface of said optical polymer material layer into a spherical profile determined through at least one parameter;
forming a substantially transmissive micro-optical element interposed at the aperture to provide a micro-electromechanical optical assembly;
releasing said micro-electromechanical optical assembly; and
disposing an optical source proximal to said micro-electromechanical optical assembly.

48. The method of claim 47, wherein said micro-electromechanical member is formed on a substantially transparent substrate.

49. The method of claim 48, wherein said substantially transparent substrate is glass.

50. An optical communication apparatus, comprising:
an optical source to emit a light beam;
a micro-electromechanical assembly coupled to the optical source and having a transmissive micro-optical element to receive the light beam for focusing and selective steering thereof, wherein the light beam is steered to provide a steered light beam for an active alignment, and the active alignment dynamically aligns the steered light beam in a selected direction responsive to an actuating force; and
a feedback control loop that maintains a spatial alignment of the steered light beam.

51. An optical communication apparatus, comprising:
an optical source to emit a light beam;
a micro-electromechanical assembly coupled to the optical source and having a transmissive micro-optical element to receive the light beam for focusing and selective steering thereof; and
an input fiber disposed in a fiber optical cross connect switch.

52. The apparatus of claim 51, wherein the micro-electromechanical assembly performs switching of said light beam received at the input fiber to optically link said received light beam to a first output fiber of a output fiber disposed substantially facing said input fiber of the fiber optical cross connect switch.

* * * * *

UNITED STATES PATENT AND TRADEMARK OFFICE
CERTIFICATE OF CORRECTION

PATENT NO.   : 6,636,653 B2                                                   Page 1 of 1
DATED        : October 21, 2003
INVENTOR(S)  : Miracky et al.

It is certified that error appears in the above-identified patent and that said Letters Patent is hereby corrected as shown below:

Column 26,
Line 44, delete "a output fiber" and insert -- a plurality of output fibers --.

Signed and Sealed this

Sixth Day of April, 2004

JON W. DUDAS
*Acting Director of the United States Patent and Trademark Office*